(12) United States Patent
Ichikawa

(10) Patent No.: US 11,707,787 B2
(45) Date of Patent: Jul. 25, 2023

(54) FILM-SHAPED FIRING MATERIAL, FILM-SHAPED FIRING MATERIAL PROVIDED WITH SUPPORT SHEET, METHOD FOR MANUFACTURING FILM-SHAPED FIRING MATERIAL, AND METHOD FOR MANUFACTURING FILM-SHAPED FIRING MATERIAL PROVIDED WITH SUPPORT SHEET

(71) Applicant: LINTEC CORPORATION, Tokyo (JP)

(72) Inventor: Isao Ichikawa, Tokyo (JP)

(73) Assignee: LINTEC Corporation, Tokyo (JP)

( * ) Notice: Subject to any disclaimer, the term of this patent is extended or adjusted under 35 U.S.C. 154(b) by 685 days.

(21) Appl. No.: 16/605,373

(22) PCT Filed: Feb. 13, 2018

(86) PCT No.: PCT/JP2018/004859
§ 371 (c)(1),
(2) Date: Oct. 15, 2019

(87) PCT Pub. No.: WO2018/198485
PCT Pub. Date: Nov. 1, 2018

(65) Prior Publication Data
US 2021/0121959 A1    Apr. 29, 2021

(30) Foreign Application Priority Data
Apr. 28, 2017  (JP) .................................. 2017-090715

(51) Int. Cl.
*B22F 7/04*    (2006.01)
*B22F 5/00*    (2006.01)
(Continued)

(52) U.S. Cl.
CPC .................. *B22F 7/04* (2013.01); *B22F 1/10* (2022.01); *B22F 5/006* (2013.01); *C09J 1/00* (2013.01);
(Continued)

(58) Field of Classification Search
CPC .... B22F 1/10; B22F 5/006; B22F 7/04; B22F 7/064; B32B 2250/24; B32B 2255/10;
(Continued)

(56) References Cited

U.S. PATENT DOCUMENTS

| 2004/0175527 A1 | 9/2004 | Shiota et al. |
| 2014/0159229 A1* | 6/2014 | Shin ........................ H01L 24/27 257/734 |

FOREIGN PATENT DOCUMENTS

| CN | 101615446 A | 12/2009 |
| CN | 102753735 A | 10/2012 |

(Continued)

OTHER PUBLICATIONS

Notice of Reasons for Rejection dated Sep. 8, 2020 in Japanese Application No. 2019-515109, with partial English translation, 5 pages.

(Continued)

*Primary Examiner* — Lawrence D Ferguson
(74) *Attorney, Agent, or Firm* — Nixon & Vanderhye P.C.

(57) ABSTRACT

This film-shaped firing material is a film-shaped firing material containing sinterable metal particles and a binder component, in which, when the average thickness of the portion of the film-shaped firing material excluding the edge portion is deemed 100%, the average thickness of the edge portion of the film-shaped firing material is at least 5% thicker than the average thickness of the portion of the film-shaped firing material excluding the edge portion.

20 Claims, 6 Drawing Sheets

(51) Int. Cl.
  *C09J 1/00* (2006.01)
  *C09J 133/08* (2006.01)
  *H01L 21/683* (2006.01)
  *H01L 23/00* (2006.01)
  *B22F 1/10* (2022.01)
  *C08K 3/08* (2006.01)

(52) U.S. Cl.
  CPC ........ *C09J 133/08* (2013.01); *H01L 21/6836* (2013.01); *H01L 24/27* (2013.01); *H01L 24/29* (2013.01); *H01L 24/83* (2013.01); *C08K 2003/0806* (2013.01); *H01L 2221/68327* (2013.01); *H01L 2224/27436* (2013.01); *H01L 2224/2929* (2013.01); *H01L 2224/29339* (2013.01); *H01L 2224/8384* (2013.01)

(58) Field of Classification Search
  CPC .......... B32B 2255/205; B32B 2255/26; B32B 2255/28; B32B 2307/302; B32B 2307/306; B32B 2307/402; B32B 2307/41; B32B 2307/412; B32B 2307/538; B32B 2307/546; B32B 2307/732; B32B 2307/748; B32B 2307/75; B32B 2457/14; B32B 27/08; B32B 27/16; B32B 27/281; B32B 27/302; B32B 27/304; B32B 27/306; B32B 27/32; B32B 27/36; B32B 27/365; B32B 27/40; B32B 3/08; B32B 7/06; B32B 7/12; C08K 2003/0806; C09J 133/08; C09J 1/00; C09J 201/00; H01L 21/6836; H01L 2221/68327; H01L 2224/27436; H01L 2224/2929; H01L 2224/29339; H01L 2224/8384; H01L 23/3737; H01L 23/42; H01L 24/27; H01L 24/29; H01L 24/83
  See application file for complete search history.

(56) References Cited

FOREIGN PATENT DOCUMENTS

| | | |
|---|---|---|
| EP | 0535711 A3 | 12/1993 |
| EP | 2 770 032 A2 | 8/2014 |
| JP | 2004-143546 | 5/2004 |
| JP | 2014-503936 | 2/2014 |
| JP | 2014-111800 | 6/2014 |
| JP | 2017-069559 | 4/2017 |
| WO | WO 2013/099545 A1 | 7/2013 |
| WO | 2015/068647 | 5/2015 |
| WO | 2017/057485 | 4/2017 |
| WO | 2017/163503 | 9/2017 |

OTHER PUBLICATIONS

International Search Report for PCT/JP2018/004859, dated Mar. 27, 2018, 4 pages.
Written Opinion of the ISA for PCT/JP2018/004859, dated Mar. 27, 2018, 6 pages.
Office Action with English translation for JP2017-090715, dated Sep. 19, 2017, 8 pages.
Office Action dated Apr. 1, 2021 in Chinese Application No. 201880027261.9 with partial English translation, 13 pages.
Extended European Search Report dated Oct. 8, 2020 in European Application No. 18790813.2, 7 pages.

\* cited by examiner

FILM-SHAPED FIRING MATERIAL, FILM-SHAPED FIRING MATERIAL PROVIDED WITH SUPPORT SHEET, METHOD FOR MANUFACTURING FILM-SHAPED FIRING MATERIAL, AND METHOD FOR MANUFACTURING FILM-SHAPED FIRING MATERIAL PROVIDED WITH SUPPORT SHEET

TECHNICAL FIELD

The present invention relates to a film-shaped firing material, a film-shaped firing material provided with a support sheet, a method for manufacturing a film-shaped firing material, and a method for manufacturing a film-shaped firing material provided with a support sheet.

This application is the U.S. national phase of International Application No. PCT/JP2018/004859 filed 13 Feb. 2018, which designated the U.S. and claims priority to Japanese Patent Application No. 2017-090715, filed on Apr. 28, 2017, the entire contents of each of which are incorporated herein by reference.

BACKGROUND ART

In recent years, as the voltage and electric current in automobiles, air conditioners and personal computers and the like has been increased, there has been a growing demand for power semiconductor elements (also known as power devices) that are mounted in these types of appliances. Power semiconductor elements are characterized by being used under conditions of high voltage and high current, and therefore heat is generated by these semiconductor elements.

Conventionally, a heat sink is sometimes fitted around the semiconductor element to dissipate the heat generated from the semiconductor element. However, if the thermal conductivity at the junction between the heat sink and the semiconductor element is not favorable, then efficient heat dissipation is hindered.

Patent Document 1 discloses an example of a bonding material having excellent thermal conductivity composed of a paste-like metal microparticle composition containing a mixture of specific heat-sinterable metal particles, a specific polymer dispersant and a specific volatile dispersion medium. By sintering this composition, a solid metal having excellent thermal conductivity is obtained.

PRIOR ART LITERATURE

Patent Document

Patent Document 1: Japanese Unexamined Patent Application, First Publication No. 2014-111800

SUMMARY OF THE INVENTION

Problems to be Solved by the Invention

However, in cases such as Patent Document 1 in which the firing material is in a paste-like form, achieving a uniform thickness for the applied paste is difficult, and the thickness stability tends to be poor. Accordingly, in order to achieve superior thickness stability, the inventors of the present invention conceived of providing firing materials that have conventionally been provided in paste form in a film-like shape.

Film-shaped firing materials typically have a release film laminated to the material for the purpose of protecting the surface. Paste-like firing materials are applied directly to the target material for sinter bonding. On the other hand, when a film-shaped firing material is used, damage to the firing material such as cohesive failure can sometimes occur when the release film is removed from the film-shaped firing material.

The present invention has been developed in light of the above circumstances, and has an object of providing a film-shaped firing material that exhibits excellent thickness stability and thermal conductivity, and is unlikely to suffer damage of the firing material during use.

Further, the present invention also has an object of providing a film-shaped firing material provided with a support sheet that contains the film-shaped firing material described above.

Further, the present invention also has an object of providing a method for manufacturing a film-shaped firing material.

Furthermore, the present invention also has an object of providing a method for manufacturing a film-shaped firing material provided with a support sheet.

Means for Solving the Problems

In other words, the present invention includes the following aspects.

[1] A film-shaped firing material including sinterable metal particles and a binder component, in which when the average thickness of the portion of the film-shaped firing material excluding the edge portion is deemed 100%, then the average thickness of the edge portion of the film-shaped firing material is at least 5% thicker than the average thickness of the portion of the film-shaped firing material excluding the edge portion.

[2] A film-shaped firing material comprising sinterable metal particles and a binder component, in which when the average thickness of the portion of the film-shaped firing material excluding the edge portion is deemed 100%, then the average thickness of the edge portion of the film-shaped firing material is at least 5% thinner than the average thickness of the portion of the film-shaped firing material excluding the edge portion.

[3] A film-shaped firing material provided with a support sheet, including the film-shaped firing material according to [1] or [2] above, a support sheet provided on one side of the film-shaped firing material, and a release film provided on the other side.

[4] The film-shaped firing material provided with a support sheet according to [3] above, in which the release film has a larger surface area than the film-shaped firing material.

[5] The film-shaped firing material provided with a support sheet according to [4] above, in which the release film contacting the edge portion of the film-shaped firing material has no incisions.

[6] A method for manufacturing a film-shaped firing material, the method including a step of printing a firing material composition containing sinterable metal particles and a binder component.

[7] A method for manufacturing a film-shaped firing material provided with a support sheet, the method including printing a composition containing sinterable metal particles and a binder component onto a release film to obtain a film-shaped firing material, and providing the film-shaped firing material on a support sheet.

Effects of the Invention

The present invention is able to provide a film-shaped firing material that exhibits excellent thickness stability and thermal conductivity, and is unlikely to suffer damage of the firing material during use.

Further, the present invention can also provide a film-shaped firing material provided with a support sheet that contains the above film-shaped firing material and can be used in the sinter bonding of a semiconductor element.

Further, the present invention can also provide a method for manufacturing a film-shaped firing material.

Furthermore, the present invention can also provide a method for manufacturing a film-shaped firing material provided with a support sheet.

EMBODIMENTS FOR CARRYING OUT THE INVENTION

Embodiments of the present invention are described below with appropriate reference to the drawings.

The drawings used in the following may sometimes be drawn with important portions enlarged as appropriate to facilitate comprehension of the features of the present invention, meaning the dimensional ratios and the like between the constituent elements are not necessarily the same as the actual values.

<<Film-Shaped Firing Material>>

A film-shaped firing material according to one embodiment of the present invention contains sinterable metal particles and a binder component, wherein if the average thickness of the portion of the film-shaped firing material excluding the edge portion is deemed 100%, then the average thickness of the edge portion of the film-shaped firing material is at least 5% thicker than the average thickness of the portion of the film-shaped firing material excluding the edge portion.

In the present description, the "average thickness" means the value that represents the average of the thickness values at 5 random locations measured in accordance with JIS K7130 using a constant pressure thickness gauge.

Figure 1A:
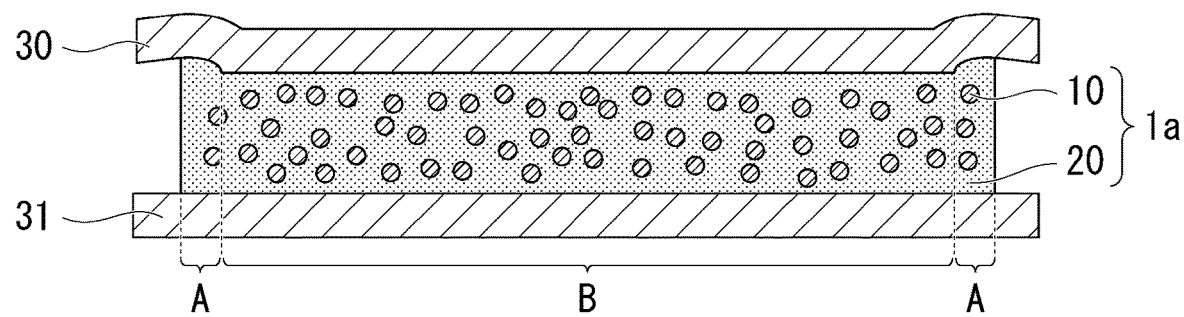
FIG. 1A is a cross-sectional view schematically illustrating a film-shaped firing material according to an embodiment of the present invention.

FIG. 1A is a cross-sectional view schematically illustrating a film-shaped firing material according to one embodiment of the present invention. The film-shaped firing material 1a contains sinterable metal particles 10 and a binder component 20.

In the film-shaped firing material 1a, the average thickness of the edge portion A is formed so as to be thicker than the average thickness of the portion B of the film-shaped firing material 1a excluding the edge portion A. The edge portion A represents the peripheral portion of the film-shaped firing material 1a. In the present description, the edge portion A is defined as the region from the outer periphery of the film-shaped firing material 1a to a point 2 mm inside the outer periphery when the film-shaped firing material 1a is viewed in plan view. The portion B excluding the edge portion represents the central portion of the film-shaped firing material 1a. In the film-shaped firing material 1a, the edge portion A on one surface of the film-shaped firing material protrudes in a convex shape. The entire edge portion A may be thicker than the average thickness of the portion B excluding the edge portion A. Alternatively, a portion of the edge portion A may be thicker than the average thickness of the portion B excluding the edge portion A. In other words, the thick portion of the film-shaped firing material 1a need not necessarily be a region that extends 2 mm inward from the outer periphery, and for example may be a region that extends 3 mm inward. Further, the thick portion of the film-shaped firing material 1a may be narrower than the region that extends 2 mm inward from the outer periphery, and for example may be a region that extends 1 mm inward.

When the average thickness of the portion of the film-shaped firing material 1a excluding the edge portion A is deemed 100%, the average thickness of the edge portion A of the film-shaped firing material 1a is at least 5% thicker, preferably 5 to 50% thicker, and more preferably 10 to 40% thicker, than the average thickness of the portion B of the film-shaped firing material 1a excluding the edge portion A. Provided the average thickness of the edge portion 1a of the film-shaped firing material is at least 5% thicker than the average thickness of the portion B of the film-shaped firing material 1a excluding the edge portion A, a first release film 30 described below can be easily detached from the film-shaped firing material 1a, and therefore damage to the film-shaped firing material 1a is unlikely to occur. Provided the average thickness of the edge portion 1a of the film-shaped firing material is not more than 150% of the average thickness of the portion B of the film-shaped firing material 1a excluding the edge portion A, the air layer of the gap between the first release film 30 and the film-shaped firing material 1a can be appropriately maintained, and inadvertent detachment of the first release film 30 from the film-shaped firing material 1a can be prevented.

In another aspect, the average thickness of the edge portion A of the film-shaped firing material 1*a* is preferably 1 to 100 µm thicker, more preferably 1 to 75 µm thicker, and even more preferably 2 to 45 µm thicker, than the average thickness of the portion B of the film-shaped firing material 1*a* excluding the edge portion A.

The average thickness of the edge portion A means the value that represents the average of the thickness values at 5 random locations measured in accordance with JIS K7130 using a constant pressure thickness gauge, but for the 5 random locations, portions that are thicker than the average thickness of the portion B excluding the edge portion A are selected. For example, 5 random locations may be selected on a line 1 mm inside the outer periphery of the film-shaped firing material 1*a*.

In a similar manner, the average thickness of the portion B excluding the edge portion A means the value that represents the average of the thickness values at 5 random locations measured in accordance with JIS K7130 using a constant pressure thickness gauge, but the 5 random locations are selected so as to be removed from the apparently thick portion of the film-shaped firing material 1*a*. For example, 5 random locations may be selected on a line 1 cm inside the outer periphery of the film-shaped firing material 1*a*.

A film-shaped firing material according to another embodiment of the present invention contains sinterable metal particles and a binder component, wherein if the average thickness of the portion of the film-shaped firing material excluding the edge portion is deemed 100%, then the average thickness of the edge portion of the film-shaped firing material is at least 5% thinner than the average thickness of the portion of the film-shaped firing material excluding the edge portion.

Figure 2A:
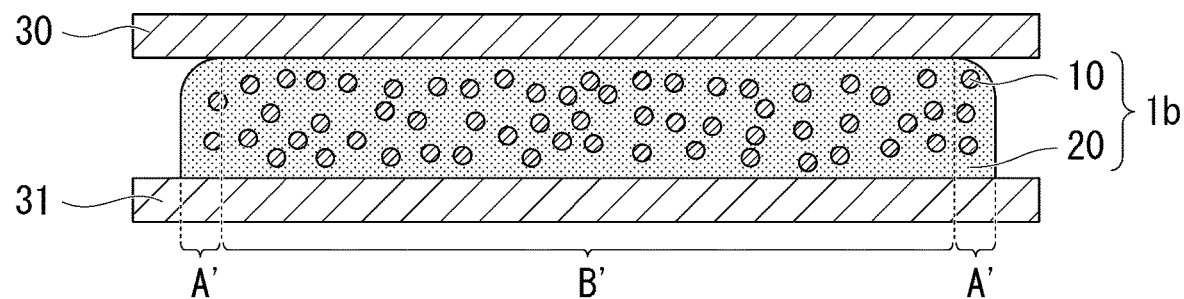
FIG. 2A is a cross-sectional view schematically illustrating a film-shaped firing material according to an embodiment of the present invention.

FIG. 2A is a cross-sectional view schematically illustrating a film-shaped firing material according to one embodiment of the present invention. The film-shaped firing material 1*b* contains sinterable metal particles 10 and a binder component 20.

In the film-shaped firing material 1*b*, the average thickness of the edge portion A' is formed so as to be thinner than the average thickness of the portion B' of the film-shaped firing material 1*b* excluding the edge portion A'. The edge portion A' represents the peripheral portion of the film-shaped firing material 1*b*. In the present description, the edge portion A' is defined as the region from the outer periphery of the film-shaped firing material 1*b* to a point 2 mm inside the outer periphery when the film-shaped firing material 1*b* is viewed in plan view. The portion B' excluding the edge portion represents the central portion of the film-shaped firing material 1*b*. In the film-shaped firing material 1*b*, the edge portion A' of one surface of the film-shaped firing material has a shape that lacks any sharp angles. The entire edge portion A' may be thinner than the average thickness of the portion B' excluding the edge portion. Alternatively, a portion of the edge portion A' may be thinner than the average thickness of the portion B' excluding the edge portion A'. In other words, the thin portion of the film-shaped firing material 1*b* need not necessarily be a region that extends 2 mm inward from the outer periphery, and for example may be a region that extends 3 mm inward. Further, the thin portion of the film-shaped firing material 1*b* may be narrower than the region that extends 2 mm inward from the outer periphery, and for example may be a region that extends 1 mm inward.

When the average thickness of the portion of the film-shaped firing material 1*b* excluding the edge portion A' is deemed 100%, the average thickness of the edge portion A' of the film-shaped firing material 1*b* is at least 5% thinner, preferably 5 to 50% thinner, and more preferably 10 to 40% thinner, than the average thickness of the portion B' of the film-shaped firing material 1*b* excluding the edge portion A'. When the average thickness of the portion B' excluding the edge portion A' is deemed 100%, then provided the average thickness of the edge portion A' is at least 5% thinner than the average thickness of the portion B' of the film-shaped firing material 1*b* excluding the edge portion A', the air layer of the gap between the first release film 30 and the film-shaped firing material 1*b* can be appropriately maintained, and inadvertent detachment of the first release film 30 from the film-shaped firing material 1*b* can be prevented. When the average thickness of the portion B' excluding the edge portion A' is deemed 100%, if the average thickness of the edge portion A' is more than 95% of the average thickness of the portion B' of the film-shaped firing material 1*b* excluding the edge portion A', then the first release film 30 is more likely to detach from the film-shaped firing material 1*b*, meaning damage to the film-shaped firing material 1*b* becomes more likely.

In another aspect, the average thickness of the edge portion A' of the film-shaped firing material 1*b* is preferably 1 to 100 µm thinner, and more preferably 2 to 45 µm thinner, than the average thickness of the portion B' of the film-shaped firing material 1*b* excluding the edge portion A'.

The average thickness of the edge portion A' means the value that represents the average of the thickness values at 5 random locations measured in accordance with JIS K7130 using a constant pressure thickness gauge, but for the 5 random locations, portions that are thinner than the average thickness of the portion B' excluding the edge portion A' are selected. For example, 5 random locations may be selected on a line 1 mm inside the outer periphery of the film-shaped firing material 1*b*.

In a similar manner, the average thickness of the portion B' excluding the edge portion A' means the value that represents the average of the thickness values at 5 random locations measured in accordance with JIS K7130 using a constant pressure thickness gauge, but the 5 random locations are selected so as to be removed from the apparently thin portion of the film-shaped firing material 1*b*. For example, 5 random locations may be selected on a line 1 cm inside the outer periphery of the film-shaped firing material 1*b*.

The film-shaped firing material may be composed of one layer (a single layer), or may be composed of a plurality of two or more layers. In those cases where the film-shaped firing material is composed of a plurality of layers, the plurality of layers may be the same or different, and there are no particular limitations on the combination of the plurality of layers, provided the effects of the present invention are not impaired.

In the present description, and not only limited to descriptions of the film-shaped firing material, the expression that "the plurality of layers may be the same or different" means that "all of the layers may be the same, all of the layers may be mutually different, or only a portion of the layers may be the same", and the expression that "the plurality of layers are mutually different" means that "at least one factor among the constituent materials, the blend ratio between the constituent materials, and the thickness differs for each layer".

The average thickness of the portion of the film-shaped firing material excluding the edge portion prior to firing is not particularly limited, but is preferably from 10 to 200 µm, more preferably from 20 to 150 µm, and even more preferably from 30 to 90 µm.

Here, "the average thickness of the portion of the film-shaped firing material excluding the edge portion" means the thickness of the total of all the elements that constitute the film-shaped firing material. For example, when the film-shaped firing material is composed of a plurality of layers, the average thickness of the portion of the film-shaped firing material excluding the edge portion means the average thickness of the total of all the layers that constitute the film-shaped firing material within the portion of the film-shaped firing material excluding the edge portion.

The average thickness of the edge portion A of the film-shaped firing material 1a is not particularly limited, but is preferably from 11 to 300 µm, more preferably from 21 to 225 µm, and more preferably from 32 to 135 µm.

The average thickness of the edge portion A' of the film-shaped firing material 1b is not particularly limited, but is preferably from 5 to 190 µm, more preferably from 10 to 143 µm, and more preferably from 15 to 86 µm.

(Release Film)

The film-shaped firing material may be provided in a laminated state on a release film. At least one of a first release film 30 and a second release film 31 may be laminated to one surface or both surfaces of the above film-shaped firing materials 1a and 1b. When the film-shaped firing material 1a or 1b is used, the first release film 30 and the second release film 31 are detached, and the film-shaped firing material 1a or 1b is placed on the sinter bonding target material. The first release film 30 and the second release film 31 also function as protective films for preventing damage to the film-shaped firing material 1a or 1b. At least one of the first release film 30 and the second release film 31 may be provided on at least one surface of the film-shaped firing material 1a or 1b, or may be provided on both surfaces of the film-shaped firing material 1a or 1b.

In those cases where the first release film 30 and the second release film 31 are laminated respectively to the two surfaces of the film-shaped firing material, it is preferable that the film-shaped firing material is first formed on the second release film 31 that has undergone a surface release treatment and functions as a heavy release film, and the first release film 30 that has undergone a surface silicone release treatment and functions as a light release film is then affixed to the opposite surface of the film-shaped firing material from the second release film 31.

In other words, it is preferable that there is a difference in the release forces at the interfaces between the respective release films and the film-shaped firing material. In the following description, the release film having the smaller release force is sometimes termed the light release film, and the release film having the larger release force is sometimes termed the heavy release film. If a difference in release force is provided, then when only the first release film 30 that functions as the light release film is detached, any concern that the film-shaped firing material may lift from the second release film 31 that functions as the heavy release film can be prevented. Specific descriptions of the release treatment methods are described below.

Examples of the first release film 30 and the second release film 31 include transparent films such as polyethylene films, polypropylene films, polybutene films, polybutadiene films, polymethylpentene films, polyvinyl chloride films, vinyl chloride copolymer films, polyethylene terephthalate films, polyethylene naphthalate films, polybutylene terephthalate films, polyurethane films, ethylene-vinyl acetate copolymer films, ionomer resin films, ethylene-(meth)acrylic acid copolymer films, ethylene-(meth)acrylate ester copolymer films, polystyrene films, polycarbonate films, polyimide films, and fluororesin films. Further, cross-linked films of these transparent films may also be used. Moreover, laminated films of these transparent films may also be used. Furthermore, films prepared by coloring or opacifying these transparent films may also be used. Examples of the release agent include silicone-based release agents, fluorine-based release agents, and long-chain alkyl group-containing carbamates and the like.

In the present description, "(meth)acrylic acid" is deemed to include both "acrylic acid" and "methacrylic acid". Terms similar to (meth)acrylic acid are also similarly defined.

The thicknesses of the first release film 30 and the second release film 31 are typically from 10 to 500 µm, preferably from 15 to 300 µm, and particularly preferably from about 20 to 250 µm.

In the case of firing materials that contain metal particles, such as the film-shaped firing material of the present embodiment, the material itself tends to have weak cohesive strength, and damage such as cohesive failure tends to occur readily upon the application of force.

Figure 1B:
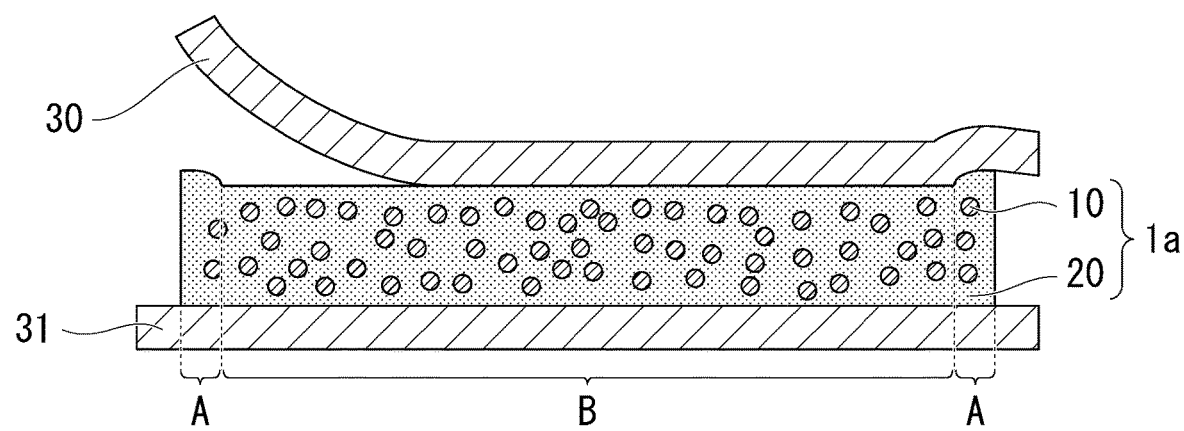
FIG. 1B is a cross-sectional view schematically illustrating a film-shaped firing material according to an embodiment of the present invention.

As illustrated in FIG. 1A, in the film-shaped firing material 1a, the average thickness of the edge portion A is formed thicker than the average thickness of the portion B of the film-shaped firing material 1a excluding the edge portion A. Specifically, if the average thickness of the portion of the film-shaped firing material 1a excluding the edge portion A is deemed 100%, then the average thickness of the edge portion A of the film-shaped firing material 1a is at least 5% thicker than the average thickness of the portion B of the film-shaped firing material excluding the edge portion. Accordingly, the first release film 30 bends upward and follows the shape of the film-shaped firing material 1a. As a result, stress develops at the interface between the first release film 30 and the film-shaped firing material 1a, meaning the first release film 30 can be detached easily from the film-shaped firing material 1a by application of an external force, and damage to the film-shaped firing material 1a is unlikely (FIG. 1B).

Figure 2B:
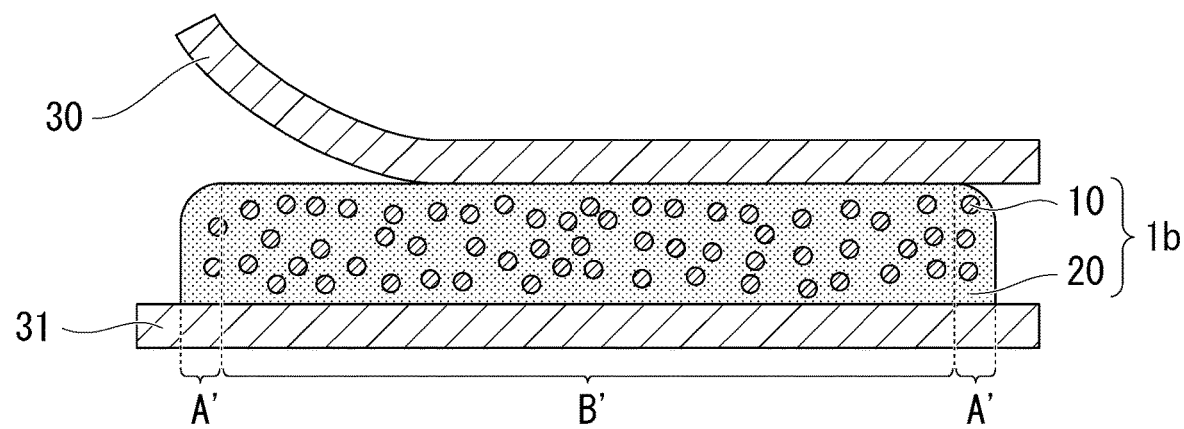
FIG. 2B is a cross-sectional view schematically illustrating a film-shaped firing material according to an embodiment of the present invention.

Further, in FIG. 2A, in the film-shaped firing material 1b, the average thickness of the edge portion A' is formed thinner than the average thickness of the portion B' of the film-shaped firing material 1b excluding the edge portion A'. Specifically, if the average thickness of the portion of the film-shaped firing material 1b excluding the edge portion A' is deemed 100%, then the average thickness of the edge portion A' of the film-shaped firing material 1b is at least 5% thinner than the average thickness of the portion B' of the film-shaped firing material excluding the edge portion A'. Accordingly, even if the first release film 30 cannot follow the shape of the film-shaped firing material 1b, an air layer exists in the gap. As a result, the contact surface area between the edge portion A' and the first release film 30 is reduced, meaning the first release film 30 can be detached easily from the film-shaped firing material 1b by application of an external force, and damage to the film-shaped firing material is unlikely (FIG. 2B).

<Sinterable Metal Particles>

The sinterable metal particles 10 are metal particles that can fuse together and form a sintered body by subjecting the film-shaped firing material 1a or 1b to a heat treatment as a firing process. By forming a sintered body, the film-shaped firing material and the fired article contacting the film-shaped firing material can be sinter bonded.

Examples of the type of metal in the sinterable metal particles 10 include silver, gold, copper, iron, nickel, aluminum, silicon, palladium, platinum, titanium, barium titanate, and oxides and alloys of these metals, but silver and silver oxide are preferred. A single type of the sinterable metal particles 10 may be added, or a combination of two or more types may be added.

The sinterable metal particles 10 are preferably silver nanoparticles, which are nano-sized silver particles.

There are no particular limitations on the particle size of the sinterable metal particles 10 contained in the film-shaped firing material 1a or 1b, provided the sinterability described above can be achieved, and the particle size may be not more than 100 nm, not more than 50 nm, or 30 nm or smaller. The lower limit for the particle size of the sinterable metal particles 10 is not particularly limited, and may, for example, be 0.5 nm. In other words, the particle size of the sinterable metal particles 10 may be at least 0.5 nm but not more than 100 nm, at least 0.8 nm but not more than 50 nm, or at least 1 nm but not more than 30 nm. The particle size of the metal particles contained in the film-shaped firing material is deemed to represent the diameter of an equivalent circle having the same projected surface area as metal particles selected randomly in an image observed using an electron microscope.

Metal particles having a particle size within the above range exhibit excellent sinterability, and are consequently preferred.

In terms of the particle size of the sinterable metal particles 10 contained in the film-shaped firing material 1a or 1b, the numerical average of the particle sizes of metal particles observed under electron microscope for which the diameter of an equivalent circle having the same projected surface area is not more than 100 nm may be from 0.1 to 95 nm, from 0.3 to 50 nm, or from 0.5 to 30 nm. The metal particles that are measured represent at least 100 particles selected randomly from a single film-shaped firing material.

The sinterable metal particles 10 may be dispersed in advance in a high-boiling point solvent with a high boiling point such as isobornylhexanol or decyl alcohol in order to achieve a state free from aggregates prior to mixing with the binder component and any other additive components. The boiling point of the high-boiling point solvent may be, for example, within a range from 200 to 350° C. By using a high-boiling point solvent at this time, because the solvent undergoes almost no volatilization at normal temperatures, the concentration of the sinterable metal particles 10 is prevented from becoming too high, and the workability is improved. In addition, reaggregation and the like of the sinterable metal particles is also prevented, and the quality tends to improve.

Examples of the method used for dispersing the sinterable metal particles 10 include a kneader, triple roll mill, beads mill, and ultrasonic waves.

In addition to the metal particles 10 (sinterable metal particles) having a particle size of not more than 100 nm, other metal particles that do not correspond with the above metal particles may also be added to the film-shaped firing material 1a or 1b of the present embodiment. In the present description, metal particles for which the diameter of an equivalent circle having the same projected surface area as a randomly selected metal particle in the image observed using an electron microscope exceeds 100 nm are termed non-sinterable metal particles. In terms of the particle size of non-sinterable metal particles having a particle size exceeding 100 nm, the numerical average of the particle sizes of metal particles observed under electron microscope for which the diameter of an equivalent circle having the same projected surface area exceeds 100 nm may be greater than 150 nm but not more than 50,000 nm, within a range from 150 to 10,000 nm, or from 180 to 5,000 nm. The metal particles that are measured represent at least 100 particles selected randomly from a single film-shaped firing material.

Examples of the type of metal in the non-sinterable metal particles having a particle size exceeding 100 nm include the same metals listed above, and silver, copper and oxides of these metals are preferred.

The metal particles having a particle size of not more than 100 nm and the non-sinterable metal particles having a particle size exceeding 100 nm may be of the same metal type or mutually different metal types. For example, the metal particles having a particle size of not more than 100 nm may be silver particles, and the non-sinterable metal particles having a particle size exceeding 100 nm may be silver or silver oxide particles. Alternatively, for example, the metal particles having a particle size of not more than 100 nm may be silver or silver oxide particles, and the non-sinterable metal particles having a particle size exceeding 100 nm may be copper or copper oxide particles.

In the film-shaped firing material 1a or 1b of the present embodiment, the amount of metal particles having a particle size of not more than 100 nm per 100 parts by mass of the total mass of all metal particles is preferably from 20 to 100 parts by mass, more preferably from 25 to 99 parts by mass, and even more preferably from 30 to 95 parts by mass.

The surface of the sinterable metal particles 10 and/or the non-sinterable metal particles may be coated with an organic substance. Having a coating film of an organic substance improves the compatibility with the binder component. Moreover, aggregation of the particles can be prevented, enabling a uniform dispersion.

In those cases where the surface of at least one of the sinterable metal particles 10 and the non-sinterable metal particles is coated with an organic substance, the mass of the sinterable metal particles 10 and the non-sinterable metal particles includes the mass of the coating substance.

In the present description, the expression that "the surface of the sinterable metal particles 10 are coated with an organic substance" does not necessarily mean that the entire surface of the sinterable metal particles 10 is coated with the organic substance.

<Binder Component>

By including the binder component 20 in the firing material, the firing material can be molded into a film-like form, and the pre-firing film-shaped firing material 1a or 1b can be imparted with adhesiveness. The binder component 20 may be a thermally decomposable component that undergoes thermal decomposition when the film-shaped firing material 1a or 1b is subjected to a heat treatment as a firing process.

Although there are no particular limitations on the binder component 20, preferred examples of the binder component 20 include resins. Examples of the resins include acrylic-based resins, polycarbonate resins, polylactic acid, and polymers of cellulose derivatives, and acrylic-based resins are preferred. Acrylic-based resins include homopolymers of (meth)acrylate compounds, copolymers of two or more (meth)acrylate compounds, and copolymers of a (meth)acrylate compound and another copolymerizable monomer.

In the resin that constitutes the binder component, the amount of structural units derived from (meth)acrylate compounds, relative to the total of all the structural units, is preferably within a range from 50 to 100% by mass, more preferably from 80 to 100% by mass, and even more preferably from 90 to 100% by mass.

Here, the term "derived from" means a change in the structure that is required for polymerization of the monomer.

Specific examples of the (meth)acrylate compound include alkyl (meth)acrylates such as methyl (meth)acrylate, ethyl (meth)acrylate, propyl (meth)acrylate, isopropyl (meth)acrylate, butyl (meth)acrylate, isobutyl (meth)acrylate, t-butyl (meth)acrylate, pentyl (meth)acrylate, amyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate and isostearyl (meth)acrylate; hydroxyalkyl (meth)acrylates such as hydroxyethyl (meth)acrylate, 2-hydroxypropyl (meth)acrylate, 4-hydroxybutyl (meth)acrylate, 3-hydroxypropyl (meth)acrylate, 2-hydroxybutyl (meth)acrylate and 3-hydroxybutyl (meth)acrylate; phenoxyalkyl (meth)acrylates such as phenoxyethyl (meth)acrylate and 2-hydroxy-3-phenoxypropyl (meth)acrylate; alkoxyalkyl (meth)acrylates such as 2-methoxyethyl (meth)acrylate, 2-ethoxyethyl (meth)acrylate, 2-propoxyethyl (meth)acrylate, 2-butoxyethyl (meth)acrylate and 2-methoxybutyl (meth)acrylate; polyalkylene glycol (meth)acrylates such as polyethylene glycol mono(meth)acrylate, ethoxy diethylene glycol (meth)acrylate, methoxy polyethylene glycol (meth)acrylate, phenoxy polyethylene glycol (meth)acrylate, nonylphenoxy polyethylene glycol (meth)acrylate, polypropylene glycol mono(meth)acrylate, methoxy polypropylene glycol mono(meth)acrylate, ethoxy polypropylene glycol mono(meth)acrylate, and nonylphenoxy polypropylene glycol mono(meth)acrylate; cycloalkyl (meth)acrylates such as cyclohexyl (meth)acrylate, 4-butylcyclohexyl (meth)acrylate, dicyclopentanyl (meth)acrylate, dicyclopentenyl (meth)acrylate, dicyclopentadienyl (meth)acrylate, bornyl (meth)acrylate, isobornyl (meth)acrylate and tricyclodecenyl (meth)acrylate; as well as benzyl (meth)acrylate and tetrahydrofurfuryl (meth)acrylate. Alkyl (meth)acrylates and alkoxyalkyl (meth)acrylates are preferred, and particularly preferred (meth)acrylate compounds include butyl (meth)acrylate, ethylhexyl (meth)acrylate, lauryl (meth)acrylate, isodecyl (meth)acrylate, 2-ethylhexyl (meth)acrylate and 2-ethoxyethyl (meth)acrylate.

A methacrylate is preferred as the acrylic resin. By incorporating structural units derived from a methacrylate in the binder component 20, firing can be conducted at comparatively low temperatures. Further, the conditions required for obtaining satisfactory adhesive strength following sintering can be satisfied.

In the resin that constitutes the binder component 20, the amount of structural units derived from methacrylates, relative to the total of all the structural units, is preferably within a range from 50 to 100% by mass, more preferably from 80 to 100% by mass, and even more preferably from 90 to 100% by mass.

There are no particular limitations on the other copolymerizable monomers, provided they are compounds that can be copolymerized with the above (meth)acrylate compound, and examples include unsaturated carboxylic acids such as (meth)acrylic acid, vinylbenzoic acid, maleic acid and vinylphthalic acid; and vinyl group-containing radical polymerizable compounds such as vinylbenzyl methyl ether, vinyl glycidyl ether, styrene, α-methylstyrene, butadiene and isoprene.

The weight average molecular weight (Mw) of the resin that constitutes the binder component 20 is preferably within a range from 1,000 to 1,000,000, and is more preferably from 10,000 to 800,000. By ensuring that the weight average molecular weight of the resin falls within the above range, satisfactory film strength can be achieved, and flexibility can be more easily imparted.

In the present description, unless specifically stated otherwise, the "weight average molecular weight" refers to the polystyrene-equivalent value measured using the gel permeation chromatography (GPC) method.

The glass transition temperature (Tg) of the resin that constitutes the binder component 20 is preferably within a range from −60 to 50° C., and is more preferably from −30 to 10° C., and even more preferably at least −20° C. but less than 0° C. By ensuring that the Tg value of the resin is not higher than the above upper limit, the adhesive strength between the film-shaped firing material 1a or 1b and the semiconductor element or the like can be improved. By ensuring that the Tg value of the resin is at least as large as the above lower limit, detachment of the film-shaped firing material 1a or 1b from the support sheet or the like described below becomes easier.

The binder component 20 may be thermally decomposable and able to be thermally decomposed by the heat treatment that functions as the firing process for the film-shaped firing material 1a or 1b. Confirmation of the thermal decomposition of the binder component 20 can be made on the basis of the mass reduction of the binder component 20 that occurs upon firing. The component that is added as the binder component 20 may undergo substantial thermal decomposition upon firing, but the total mass of the component added as the binder component 20 need not necessarily undergo thermal decomposition upon firing.

The mass of the binder component 20 following firing, relative to a value of 100% by mass for the mass of the binder component 20 prior to firing, may be not more than 10% by mass, not more than 5% by mass, or 3% by mass or less.

Besides the sinterable metal particles 10, the non-sinterable metal particles and the binder component 20 described above, the film-shaped firing material 1a or 1b of the present embodiment may also contain other additives that do not correspond with any of the sinterable metal particles 10, the non-sinterable metal particles and the binder component 20 described above, provided the effects of the present invention are not impaired.

Examples of these other additives that may be included in the film-shaped firing materials 1a and 1b include solvents, dispersants, plasticizers, tackifiers, storage stabilizers, anti-foaming agents, thermal decomposition promoters and anti-oxidants. A single type of additive may be included, or two or more additives may be included. There are no particular limitations on these additives, and the types of additives typically used in this field may be selected as appropriate.

<Composition>

The film-shaped firing material 1a or 1b of the present embodiment may be composed of the sinterable metal particles 10 and the binder component 20, and the sum of the amounts (% by mass) of these materials may total 100% by mass.

Alternatively, the film-shaped firing material 1a or 1b of the present embodiment may be composed of the sinterable metal particles 10, the binder component 20 and other additives, and the sum of the amounts (% by mass) of these materials may total 100% by mass.

In those cases where the film-shaped firing material 1a or 1b of the present embodiment contains non-sinterable metal particles, the film-shaped firing material 1a or 1b may be composed of the sinterable metal particles 10, the non-sinterable metal particles and the binder component 20, and the sum of the amounts (% by mass) of these materials may total 100% by mass.

In those cases where the film-shaped firing material 1a or 1b of the present embodiment contains non-sinterable metal particles, the film-shaped firing material 1a or 1b may be composed of the sinterable metal particles 10, the non-sinterable metal particles, the binder component 20 and other additives, and the sum of the amounts (% by mass) of these materials may total 100% by mass.

In the film-shaped firing material 1a or 1b, the amount of the sinterable metal particles 10 relative to 100% by mass of the total mass of all of the components besides the solvent (hereafter referred to as "the solid fraction") is preferably within a range from 10 to 98% by mass, more preferably from 15 to 90% by mass, and even more preferably from 20 to 80% by mass.

In those cases where the film-shaped firing material 1a or 1b contains non-sinterable metal particles, the total amount of the sinterable metal particles 10 and the non-sinterable metal particles relative to 100% by mass of the total solid fraction in the film-shaped firing material 1a or 1b is preferably within a range from 50 to 98% by mass, more preferably from 70 to 95% by mass, and even more preferably from 80 to 90% by mass. In this case, the amount of the sinterable metal particles 10 relative to 100% by mass of the total solid fraction in the film-shaped firing material 1a or 1b is preferably within a range from 15 to 93% by mass, more preferably from 21 to 90% by mass, and even more preferably from 24 to 86% by mass.

In the film-shaped firing material 1a or 1b, the amount of the binder component 20 relative to 100% by mass of the total mass of all of the components besides the solvent is preferably within a range from 2 to 50% by mass, more preferably from 5 to 30% by mass, and even more preferably from 10 to 20% by mass.

In the film-shaped firing material 1a or 1b, the mass ratio between the sinterable metal particles 10 and the binder component 20 (sinterable metal particles:binder component) is preferably within a range from 50:1 to 1:5, more preferably from 20:1 to 1:2, and even more preferably from 10:1 to 1:1. In those cases where the film-shaped firing material 1a or 1b contains non-sinterable metal particles, the mass ratio between the total of the sinterable metal particles 10 and non-sinterable particles, and the binder component 20 {(sinterable metal particles+non-sinterable metal particles): binder component} is preferably within a range from 50:1 to 1:1, more preferably from 20:1 to 2:1, and even more preferably from 9:1 to 4:1.

The film-shaped firing material 1a or 1b may contain a high-boiling point solvent that is used when mixing the sinterable metal particles 10, the binder component 20 and the other additive components. The amount of the high-boiling point solvent relative to 100% by mass of the total mass of the film-shaped firing material 1a or 1b is preferably not more than 20% by mass, more preferably not more than 15% by mass, and even more preferably 10% by mass or less.

Because the film-shaped firing material 1a or 1b of the present embodiment described above has a film-like shape, the thickness stability is excellent. Further, because the film-shaped firing material 1a or 1b of the present embodiment contains sinterable metal particles, the thermal conductivity is excellent. Moreover, in the film-shaped firing material of the present embodiment, if the average thickness of the portion of the film-shaped firing material 1a or 1b excluding the edge portion is deemed 100%, then the average thickness of the edge portion of the film-shaped firing material is either at least 5% thicker, or at least 5% thinner, than the average thickness of the portion of the film-shaped firing material excluding the edge portion. Accordingly, during use, namely when detaching the first release film 30 from the film-shaped firing material 1a or 1b, damage of the firing material is unlikely.

<<Method for Manufacturing Film-Shaped Firing Material>>

The film-shaped firing material can be formed using a firing material composition containing the constituent materials.

The firing material composition can be obtained by mixing at least sinterable metal particles, a binder and a solvent. The firing material composition may also contain non-sinterable metal particles.

The mass of the sinterable metal particles relative to the total mass of the firing material composition is preferably from 10 to 98% by mass, and more preferably from 15 to 90% by mass.

The mass of the binder component relative to the total mass of the firing material composition is preferably from 5 to 30% by mass, and more preferably from 10 to 25% by mass.

The mass of the solvent relative to the total mass of the firing material composition is preferably from 5 to 40% by mass, and more preferably from 7 to 30% by mass.

The method for manufacturing a film-shaped firing material according to the present embodiment has a step of printing the firing material composition containing at least sinterable metal particles, a binder component and a solvent.

For example, by printing the firing material composition onto a surface on which a film-shaped firing material is to be formed, and then performing drying if necessary to volatilize the solvent, a film-shaped adhesive can be formed in the target region.

The solvent may be any solvent that can be dried and volatilized following printing, and solvents having boiling points within a range from 65° C. to 350° C. are preferred. Examples include low-boiling point solvents such as n-hexane (boiling point: 68° C.), ethyl acetate (boiling point: 77° C.), 2-butanone (boiling point: 80° C.), n-heptane (boiling point: 98° C.), methylcyclohexane (boiling point: 101° C.), toluene (boiling point: 111° C.), acetylacetone (boiling point: 138° C.), n-xylene (boiling point: 139° C.), and dimethylformamide (boiling point: 153° C.).

Further, in order to suppress any increase in viscosity caused by solvent volatilization during printing, a high-boiling point solvent having a boiling point of 200° C. or higher may be used, and examples include isophorone (boiling point: 215° C.), butyl carbitol (boiling point: 230° C.), 1-decanol (boiling point: 233° C.), butyl carbitol acetate (boiling point: 247° C.) and isobornyl cyclohexanol (boiling point: 318° C.).

These solvents may be used individually, or a combination of solvents may be used.

If the boiling point of the solvent exceeds 350° C., then the solvent tends to be retained inside the film-shaped firing material during firing of the film-shaped firing material, which can cause a degradation in the bonding adhesion. In other words, provided the boiling point of the solvent is not more than 350° C., the solvent is not retained inside the film-shaped firing material during firing of the film-shaped firing material, and the bonding adhesion is less likely to be degraded. If the boiling point of the solvent is lower than 65° C., then volatilization can occur during printing, and there is a possibility that the thickness stability of the film-shaped firing material may be impaired. In other words, provided the boiling point of the solvent is at least 65° C., volatilization does not occur during printing, and good stability in the thickness of the film-shaped firing material can be maintained.

An example of the printing target surface for the firing material composition is the surface of a release film.

The printing of the firing material composition can be performed using conventional printing methods, and examples include relief printing such as flexographic printing, intaglio printing such as gravure printing, lithographic printing such as offset printing, screen printing such as silk screen printing and rotary screen printing, and printing using various types of printers including inkjet printers.

The shape of the printing of the firing material composition may be set appropriately in accordance with the shape of the sinter bonding target, but a circular shape or rectangular shape is preferred. The circular shape may be a shape that corresponds with the shape of a semiconductor wafer. The rectangular shape may be a shape that corresponds with the shape of a semiconductor element. This corresponding shape may be a shape that is the same or substantially the same as the shape of the sinter bonding target.

In those cases where the printed firing material composition has a circular shape, the surface area of the circle may be within a range from 3.5 to 1,600 cm², or may be from 85 to 1,400 cm². In those cases where the printed firing material composition has a rectangular shape, the surface area of the rectangle may be within a range from 0.01 to 25 cm², or may be from 0.25 to 9 cm².

The thickness of the edge portion of the printed firing material composition may be such that, if the average thickness of the portion of the firing material composition excluding the edge portion is deemed 100%, then the average thickness of the edge portion of the firing material composition may be at least 5% thicker than the average thickness of the portion of the firing material composition excluding the edge portion. Further, the composition may have the above thicknesses after drying of the firing material composition.

In a similar manner, the thickness of the edge portion of the printed firing material composition may be such that, if the average thickness of the portion of the firing material composition excluding the edge portion is deemed 100%, then the average thickness of the edge portion of the firing material composition may be at least 5% thinner than the average thickness of the portion of the firing material composition excluding the edge portion. Further, the composition may have the above thicknesses after drying of the firing material composition.

There are no particular limitations on the drying conditions for the firing material composition, but in those cases where the firing material composition contains a solvent, drying under heat is preferred. In such cases, the firing material composition is preferably dried under conditions including, for example, heating at a temperature of 70 to 250° C. for a period of 10 seconds to 10 minutes.

By using the method for manufacturing a film-shaped firing material according to the present embodiment, a film-shaped firing material of the present invention can be manufactured. Depending on properties such as the viscosity and surface tension of the firing material composition that is used, the manufactured film-shaped firing material may adopt the shape of the film-shaped firing material 1a or the film-shaped firing material 1b described above. If the viscosity of the firing material composition that is used is high, then a shape tends to be formed in which the average thickness of the edge portion of the film-shaped firing material is thicker than the average thickness of the portion of the film-shaped firing material excluding the edge portion, as described for the film-shaped firing material 1a. For example, if the viscosity of the firing material composition is from 10 to 100 Pa·s, then a shape tends to be formed in which the average thickness of the edge portion of the film-shaped firing material is thicker than the average thickness of the portion of the film-shaped firing material excluding the edge portion. If the viscosity of the firing material composition that is used is low, then a shape tends to be formed in which the average thickness of the edge portion of the film-shaped firing material is thinner than the average thickness of the portion of the film-shaped firing material excluding the edge portion, as described for the film-shaped firing material 1b. For example, if the viscosity of the firing material composition is from 0.1 to 5 Pa·s, then a shape tends to be formed in which, as described for the film-shaped firing material 1b, the average thickness of the edge portion of the film-shaped firing material is thinner than the average thickness of the portion of the film-shaped firing material excluding the edge portion.

If the surface tension on the firing material composition that is used is high, then the contact angle with the release film surface that represents the printing surface increases, and a shape tends to be formed in which the average thickness of the edge portion of the film-shaped firing material is thicker than the average thickness of the portion of the film-shaped firing material excluding the edge portion, as described for the film-shaped firing material 1a. If the surface tension on the firing material composition that is used is low, then the contact angle with the release film surface decreases, and a shape tends to be formed in which the average thickness of the edge portion of the film-shaped firing material is thinner than the average thickness of the portion of the film-shaped firing material excluding the edge portion, as described for the film-shaped firing material 1b.

The film-shaped firing material of the present invention is not limited to materials manufactured using the method for manufacturing a film-shaped firing material of the present embodiment.

In the case of a conventional paste-like firing material, the material is applied directly to the sinter bonding target. On the other hand, when the shape of a film-shaped firing material is adjusted to match the shape of the sinter bonding target, typically, a film having a large surface area is first manufactured, and that film is then cut to the desired shape.

However, depending on the shape that is cut, a large amount of cutting scraps may be generated. Because these cutting scraps are discarded, the yield relative to the raw materials tends to deteriorate. At the same time, the product cost also tends to increase.

In contrast, by using the method for manufacturing a film-shaped firing material according to the present embodiment, the desired shape can be produced from the outset. As a result, cutting scraps are not generated, and the yield relative to the raw materials improves. In particular, the sinterable metal particles contained in the film-shaped firing material tend to be a comparatively expensive material, and therefore reducing raw material waste loss leads to a significant reduction in the product cost, which is very beneficial.

<<Film-Shaped Firing Material Provided with Support Sheet>>

A film-shaped firing material provided with a support sheet according to this embodiment contains a film-shaped firing material of one of the embodiments of the present invention, a support sheet provided on one side of the film-shaped firing material, and a release film provided on the other side. The support sheet preferably has an adhesive layer provided across the entire surface of, or around the periphery of, a substrate film, with the film-shaped firing material provided in direct contact with the adhesive layer. Alternatively, the film-shaped firing material is preferably provided in direct contact with the substrate film. By adopting this configuration, the material can be used as a dicing sheet that is used when dicing a semiconductor wafer into individual elements, and by using a blade or the like to cut the material into individual elements together with the wafer, the material can be processed into film-shaped firing materials having the same shape as the elements, thus enabling the manufacture of semiconductor elements that are provided with a film-shaped firing material.

Figure 3:
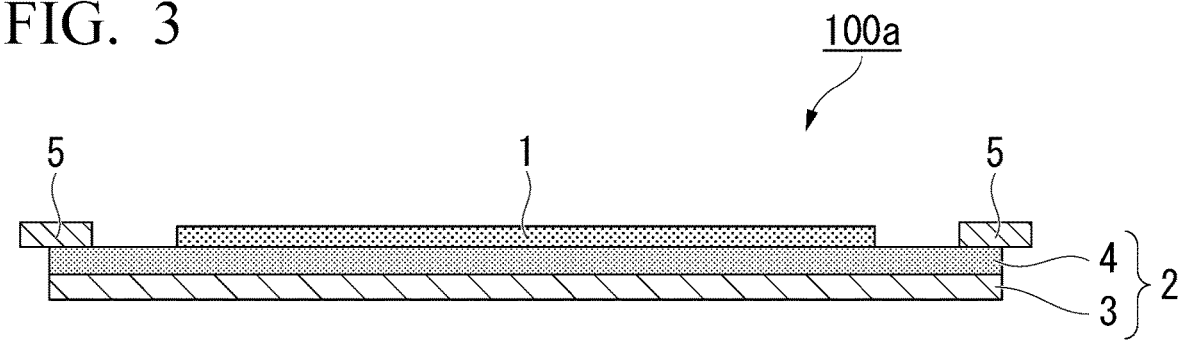
FIG. 3 is a cross-sectional view schematically illustrating a film-shaped firing material provided with a support sheet according to an embodiment of the present invention.
Figure 4:
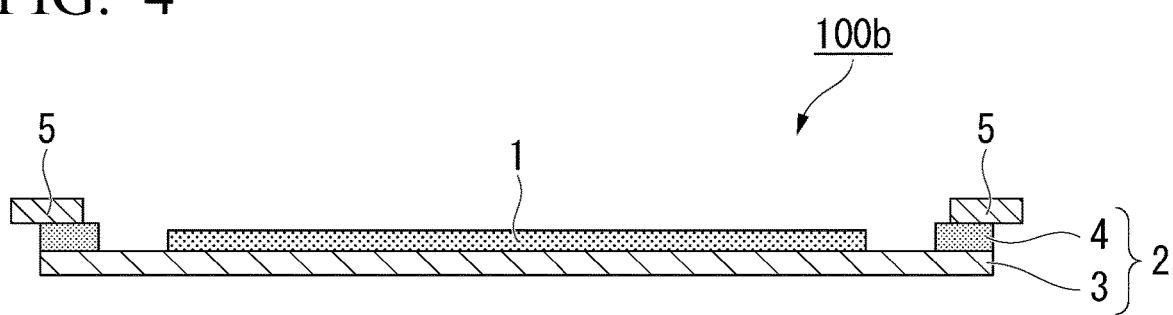
FIG. 4 is a cross-sectional view schematically illustrating a film-shaped firing material provided with a support sheet according to an embodiment of the present invention.
Figure 5:
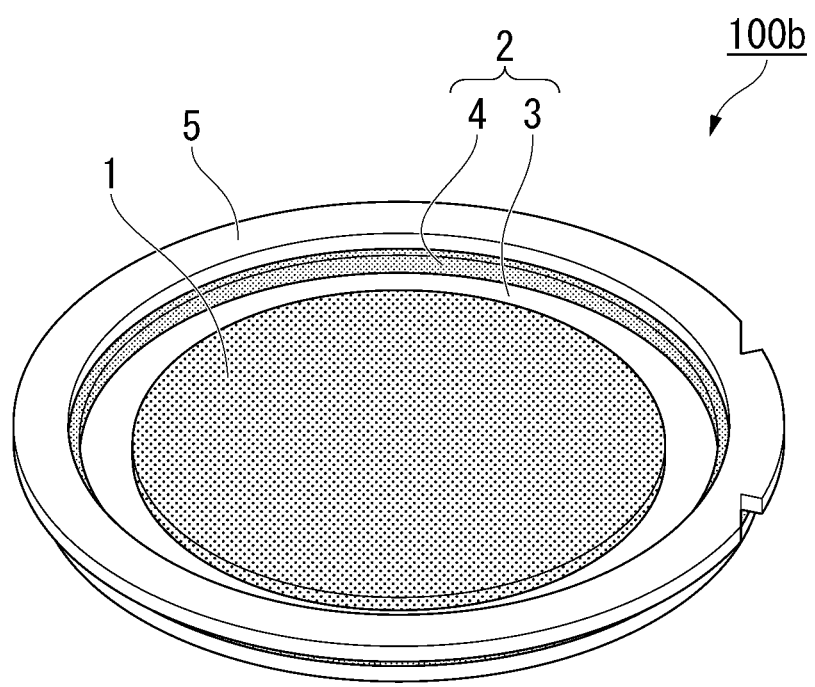
FIG. 5 is a diagram schematically illustrating a state in which a film-shaped firing material provided with a support sheet according to an embodiment of the present invention has been affixed to a ring frame.

A number of embodiments of the film-shaped firing material provided with a support sheet are described below. FIG. 3 and FIG. 4 each illustrates a schematic cross-sectional view of a film-shaped firing material provided with a support sheet according to an embodiment of the present invention. FIG. 5 is a diagram that schematically illustrates a state in which a film-shaped firing material provided with a support sheet according to an embodiment of the present invention has been affixed to a ring frame. As illustrated in FIG. 3 and FIG. 4, film-shaped firing materials provided with a support sheet 100a and 100b according to embodiments of the present invention have a film-shaped firing material 1 temporarily affixed in a releasable manner to the inner peripheral portion of a support sheet 2 having an adhesive portion on the outer peripheral portion. For example, as illustrated in FIG. 3, the support sheet 2 may be an adhesive sheet having an adhesive layer 4 provided on the upper surface of a substrate film 3, and have a structure in which the inner peripheral surface of the adhesive layer 4 is covered with the film-shaped firing material 1, and the adhesive layer is exposed at the outer peripheral portion. In other words, the support sheet 2 has the substrate film 3 and the adhesive layer 4 that covers substantially the entire surface of the substrate film 3. The film-shaped firing material 1 is positioned on the adhesive layer 4 so that the peripheral edge of the adhesive layer 4 and the vicinity thereof, namely the outer peripheral portion, of the adhesive layer 4, is exposed. This exposed portion of the adhesive layer 4 functions as an adhesive portion. Further, as illustrated in FIG. 4 and FIG. 5, the support sheet 2 may have a structure that has a ring-shaped adhesive layer 4 around the outer peripheral portion of the substrate film 3. For example, the support sheet 2 has the substrate film 3 and a ring-shaped adhesive layer 4 positioned around the peripheral edge of the substrate film 3. The film-shaped firing material 1 is positioned so as to contact the substrate film 3 and be encircled by the adhesive layer 4.

The film-shaped firing material 1 is formed on the inner peripheral portion of the support sheet 2 with substantially the same shape as the work (the semiconductor wafer or the like) that is to be attached. The support sheet 2 has an adhesive portion at the outer peripheral portion. In a preferred embodiment, a film-shaped firing material 1 having a smaller diameter than the support sheet 2 is laminated concentrically on the circular support sheet 2. The outer peripheral adhesive portion is used for securing to a ring frame 5, as illustrated in the drawings.

Figure 6A:
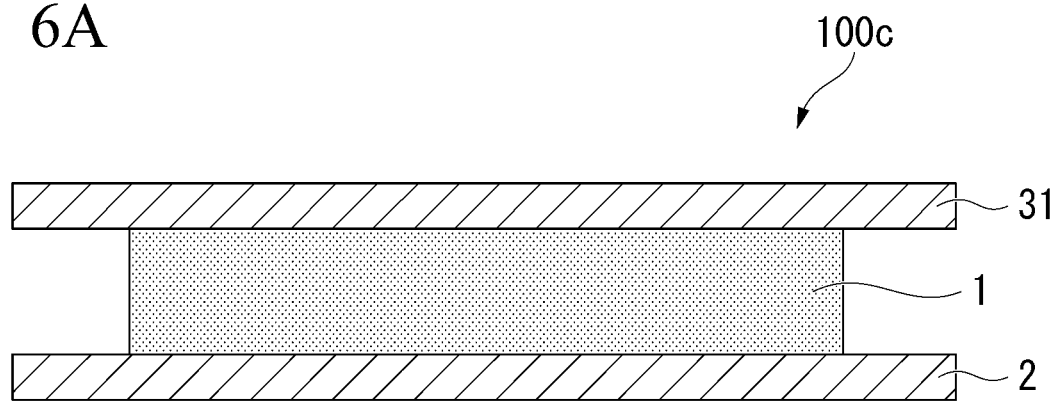
FIG. 6A is a cross-sectional view schematically illustrating a film-shaped firing material provided with a support sheet according to an embodiment of the present invention.

FIG. 6A is a cross-sectional view schematically illustrating a film-shaped firing material provided with a support sheet according to the present embodiment. The second release film 31 of the film-shaped firing material provided with a support sheet 100c has a larger surface area than the film-shaped firing material 1, and extends beyond the edge of the film-shaped firing material 1. Moreover, the film-shaped firing material provided with a support sheet 100c illustrated in FIG. 6A does not have an incision in the second release film 31 at the contact location with the edge portion of the film-shaped firing material 1.

Figure 7A:
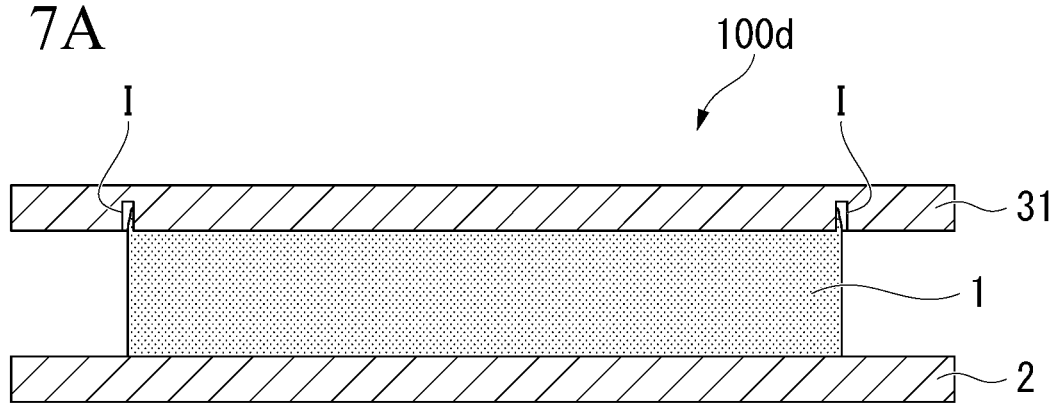
FIG. 7A is a cross-sectional view schematically illustrating one example of a film-shaped firing material provided with a support sheet produced by a conventional processing method.

FIG. 7A is a cross-sectional view schematically illustrating one example of a film-shaped firing material provided with a support sheet produced by a conventional processing method. The film-shaped firing material provided with a support sheet 100c and the film-shaped firing material provided with a support sheet 100d have the same structure, but in the film-shaped firing material provided with a support sheet 100d, an incision I is formed in the second release film 31 at the contact location with the edge portion of the film-shaped firing material 1.

Figure 6B:
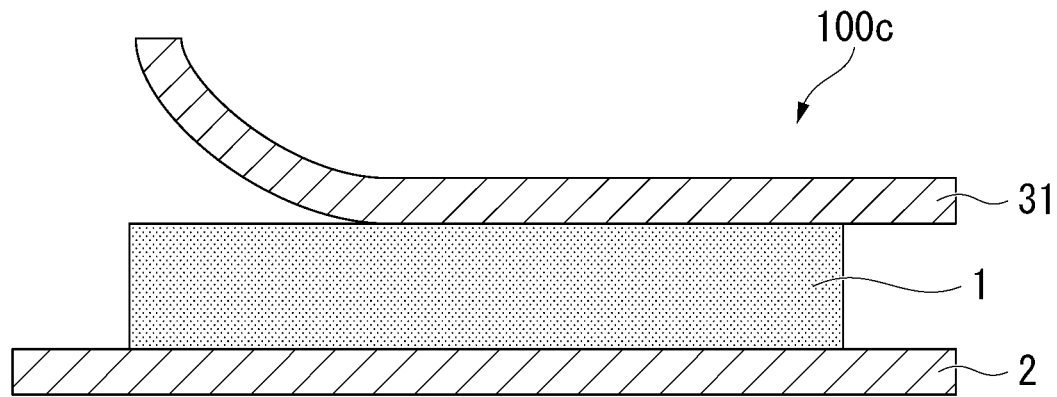
FIG. 6B is a cross-sectional view schematically illustrating a film-shaped firing material provided with a support sheet according to an embodiment of the present invention.

The second release film 31 of the film-shaped firing material provided with a support sheet 100c illustrated in FIG. 6A has a large surface area than the film-shaped firing material 1. Further, the second release film 31 of the film-shaped firing material provided with a support sheet 100c extends beyond the edge of the film-shaped firing material 1. Moreover, there is no incision in the second release film 31. As a result, when the second release film 31 is detached from the film-shaped firing material 1, damage to the film-shaped firing material 1 is unlikely (FIG. 6B).

Figure 7B:
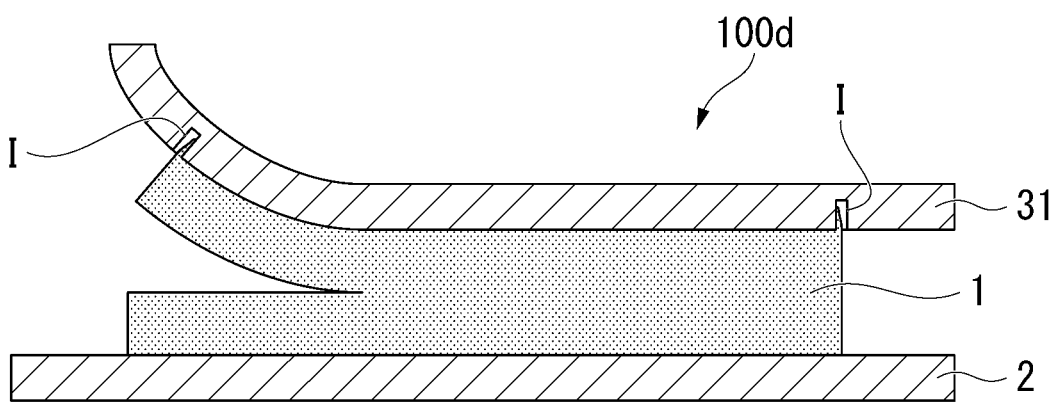
FIG. 7B is a cross-sectional view schematically illustrating one example of a film-shaped firing material provided with a support sheet produced by a conventional processing method.

When there is an incision I in the second release film 31 at the contact location with the edge portion of the film-shaped firing material, as in the case of the film-shaped firing material provided with a support sheet 100d illustrated in FIG. 7A, the film-shaped firing material 1 becomes partially embedded in the incision I during the process for forming the incision I. As a result, when the second release film 31 is detached from the film-shaped firing material 1, there is a possibility that the film-shaped firing material 1 may detach from the support sheet 2 (FIG. 7B). Further, there is a possibility that damage such as cohesive failure may occur in the film-shaped firing material 1 (FIG. 7B).

The film-shaped firing materials 1a and 1b illustrated in FIGS. 1A and 2A do not have an incision in the second release film 31 at the contact location with the edge portion of the firing material. Further, if the average thickness of the portion of the film-shaped firing material 1a or 1b excluding the edge portion is deemed 100%, then the average thickness of the edge portion of the film-shaped firing material 1a or 1b is at least 5% thicker, or at least 5% thinner, than the average thickness of the portion of the film-shaped firing material 1a or 1b excluding the edge portion. By doing this, when the film-shaped firing material 1a or 1b is detached from the first release film 30, stable detachment can be achieved at the targeted interface between the film-shaped firing material 1 and the first release film 30. Moreover, damage to the film-shaped firing material is unlikely.

Incisions in the second release film 31 can occur during cutting of the film-shaped firing material 1 provided on the second release film 31.

However, by using the method for manufacturing a film-shaped firing material provided with a support sheet described below, provided the film-shaped firing material 1 is provided on the support sheet 2, the film-shaped firing material 1 can be formed with the desired shape without performing cutting. Therefore, a film-shaped firing material provided with a support sheet that has no incisions in the second release film 31 can be obtained easily.

(Substrate Film)

There are no particular limitations on the substrate film 3 that represents a constituent material of the support sheet 2, and for example, films formed from low-density polyethylene (LDPE), linear low-density polyethylene (LLDPE), ethylene-propylene copolymers, polypropylene, polybutene, polybutadiene, polymethylpentene, ethylene-vinyl acetate copolymers, ethylene-(meth)acrylic acid copolymers, ethylene-methyl (meth)acrylate copolymers, ethylene-ethyl (meth)acrylate copolymers, polyvinyl chloride, vinyl chloride-vinyl acetate copolymers, polyurethane films, or ionomers or the like may be used.

Further examples include heat-resistant polyester films such as polyethylene terephthalate, polybutylene terephthalate and polyethylene naphthalate, and polyolefin films such as polypropylene and polymethylpentene. Furthermore, crosslinked versions of these films and modified films that have been modified by irradiation or electric discharge may also be used. The substrate film may also be a laminate of any of the above films.

Furthermore, two or more of these films may be laminated together and used in combination. Moreover, versions of these films that have been subjected to coloring or printing or the like may also be used. Furthermore, the film may be made into a sheet-like form by extruding a thermoplastic resin, may be a stretched film, or may be made into a sheet-like form by using a prescribed device to convert a curable resin into a thin film-like form and then curing the resin.

The thickness of the substrate film is not particularly limited, but is preferably within a range from 30 to 300 µm, and more preferably from 50 to 200 µm. By ensuring that the thickness of the substrate film falls within the above range, rupture of the substrate film is unlikely to occur when cutting by dicing is performed. Further, because satisfactory flexibility is imparted to the film-shaped firing material provided with a support sheet, favorable adhesion to the work (for example, a semiconductor wafer or the like) is achieved.

The substrate film can also be obtained by performing a release treatment by applying a release agent to the surface. Examples of release agents that may be used for the release treatment include alkyd-based, silicone-based, fluorine-based, unsaturated polyester-based, polyolefin-based and wax-based release agents and the like, and alkyd-based, silicone-based and fluorine-based release agents are preferred as they also have heat resistance.

In order to subject the surface of the substrate film to a release treatment using the release agent described above, the following steps may be performed. The release agent is applied using a gravure coater, Meyer bar coater, air knife coater or roll coater or the like, either in a solvent-free state composed of only the release agent, or in a solvent-diluted or emulsified state. Subsequently, the substrate film with the applied release agent is cured, either at normal temperature or under heating, or by irradiation with an electron beam, and a laminate is formed by wet lamination, dry lamination, hot melt lamination, melt extrusion lamination, or coextrusion processing or the like.

(Adhesive Layer)

The support sheet 2 described above has the adhesive layer 4 provided either across the entire surface of, or on the outer peripheral portion of, the substrate film 3. The support sheet 2 has an adhesive portion at least at the outer peripheral portion of the sheet. The adhesive portion has the function of temporarily securing the ring frame 5 at the outer periphery of the film-shaped firing material 1a or 1b. The ring frame 5 is preferably able to be detached from the adhesive portion following a prescribed step. Therefore, a material having weak adhesiveness may be used as the adhesive layer 4, or an energy ray-curable material for which the adhesive strength can be reduced by irradiation with energy rays may be used. Re-releasable adhesive layers can be formed from various conventional adhesives (for example, general purpose adhesives such as rubber-based, acrylic-based, silicone-based, urethane-based and vinyl ether-based adhesives, adhesives having surface unevenness, energy ray-curable adhesives, and thermally expandable component-containing adhesives and the like).

In the configuration shown in FIG. 4, a ring-shaped adhesive layer 4 is formed on the outer peripheral portion of the substrate film 3 to generate an adhesive portion. At this time, the adhesive layer 4 may be a single-layer adhesive layer formed from an adhesive described above, or may be a double-sided adhesive tape containing an adhesive layer formed from an aforementioned adhesive that has been cut into a ring shape.

Further, the support sheet 2 may have a configuration which, as illustrated in FIG. 3, is an adhesive sheet of a typical structure having the adhesive layer 4 formed across the entire upper surface of the substrate film 3, wherein the inner peripheral surface of the adhesive layer 4 is covered with the film-shaped firing material, but the outer peripheral portion has the adhesive portion exposed. In this case, the outer peripheral portion of the adhesive layer 4 is used for securing the ring frame 5 described above, and the film-shaped firing material is laminated in a releasable manner to the inner peripheral portion. In a similar manner to that described above, a material having weak adhesiveness may be used as the adhesive layer 4, or an energy ray-curable adhesive may be used.

In a support sheet having the structure illustrated in FIG. 3, in those cases where an energy ray-curable re-releasable adhesive layer is used, the region onto which the film-shaped firing material is to be laminated may be irradiated in advance with energy rays to reduce the adhesiveness. At this time, the remaining other region is not irradiated with the energy rays, and may retain a powerful adhesive strength, for example for the purpose of bonding to the ring frame 5. In order to ensure that the energy ray irradiation is not performed only in this other region, an energy ray shielding layer may be provided by printing or the like on the region of the substrate film corresponding with this other region, and energy ray irradiation may then be performed from the substrate film side of the structure. Further, in a support sheet having the structure illustrated in FIG. 3, in order to strengthen the adhesion between the substrate film 3 and the adhesive layer 4, the surface of the substrate film 3 on which the adhesive layer 4 is to be provided may, if desired, be subjected to a roughening treatment such as sandblasting or a solvent treatment, or to an oxidation treatment such as a corona discharge treatment, electron beam irradiation, plasma treatment, ozone-ultraviolet irradiation treatment, flame treatment, chromic acid treatment, or hot air treatment or the like. Furthermore, a primer treatment may also be performed.

The thickness of the adhesive layer 4 is not particularly limited, but is preferably within a range from 1 to 100 µm, more preferably from 2 to 80 µm, and particularly preferably from 3 to 50 µm.

(Film-Shaped Firing Material Provided with Support Sheet)

The film-shaped firing material provided with a support sheet has the film-shaped firing material adhered temporarily in a releasable manner on the inner peripheral portion of a support sheet that has an adhesive portion on the outer peripheral portion. In other words, the film-shaped firing material provided with a support sheet contains a support sheet, an adhesive portion that is provided on at least the outer peripheral portion of the support sheet and is positioned on top of the support sheet, and a film-shaped firing material that is surrounded by the adhesion portion and is positioned on top of the support sheet, wherein the film-shaped firing material is adhered temporarily to the support sheet in a releasable manner. Here, the expression that "the film-shaped firing material is adhered temporarily to the support sheet in a releasable manner" is not limited to the case where the film-shaped firing material contacts the support sheet directly, but also includes those cases where an adhesive portion exists between the film-shaped firing material and the support sheet. In the structural example illustrated in FIG. 3, the film-shaped firing material provided with a support sheet 100a has a structure in which the film-shaped firing material 1 is laminated in a releasable manner to the inner peripheral portion of the support sheet 2 composed of the substrate film 3 and the adhesive layer 4, and the adhesive layer 4 is exposed at the outer peripheral portion of the support sheet 2. In this structural example, the film-shaped firing material 1 that has a smaller diameter than the support sheet 2 is preferably laminated concentrically in a releasable manner to the adhesive layer 4 of the support sheet 2.

The film-shaped firing material provided with a support sheet 100a of the above structure is attached to the ring frame 5 at the exposed adhesive layer 4 in the outer peripheral portion of the support sheet 2.

Further, a separate ring-shaped double-sided tape or adhesive layer may be provided on the region of overlap with the ring frame (the exposed adhesive layer at the outer peripheral portion of the adhesive sheet). A double-sided tape has a laminated structure composed of adhesive layer/core material/adhesive layer. There are no particular limitations on the adhesive layers in the double-sided tape, and rubber-based, acrylic-based, silicone-based, or polyvinyl ether-based adhesives or the like may be used. During production of the element described below, the adhesive layer is affixed to the ring frame at the outer peripheral portion of the element. Examples of materials that can be used favorably as the core material of the double-sided tape include polyester films, polypropylene films, polycarbonate films, polyimide films, fluororesin films, and liquid crystal polymer films and the like.

In the structural example illustrated in FIG. 4, a ring-shaped adhesive layer 4 is formed on the outer peripheral portion of the substrate film 3, thereby forming an adhesive portion. At this time, the adhesive layer 4 may be a single-layer adhesive layer formed from an adhesive described above, or may be a double-sided adhesive tape containing an adhesive layer formed from an aforementioned adhesive that has been cut into a ring shape. The film-shaped firing material 1 is laminated in a releasable manner to the inner peripheral portion of the substrate film 3 surrounded by the adhesive portion. In this structural example, the film-shaped firing material 1 that has a smaller diameter than the support sheet 2 is preferably laminated concentrically in a releasable manner on the substrate film 3 of the support sheet 2.

A release film may be provided on the film-shaped firing material provided with a support sheet for the purpose of surface protection, by preventing the surface of one or both of the film-shaped firing material and the adhesive portion from contacting the external atmosphere until the material is ready for use.

The release film can also be obtained by performing a release treatment by applying a release agent to the surface of a substrate film such as the previously mentioned polyethylene, polyethylene terephthalate, polybutylene terephthalate, polyethylene naphthalate or polypropylene. Examples of release agents that may be used for the release treatment include alkyd-based, silicone-based, fluorine-based, unsaturated polyester-based, polyolefin-based and wax-based release agents and the like, and in particular, alkyd-based, silicone-based and fluorine-based release agents are preferred as they also have heat resistance.

In order to subject the surface of the substrate film to a release treatment using the release agent described above, the release agent may be applied using a gravure coater, Meyer bar coater, air knife coater or roll coater or the like, either in a solvent-free state composed of only the release agent, or in a solvent-diluted or emulsified state, and the substrate film with the applied release agent may then be cured, either at normal temperature or under heating, or by irradiation with an electron beam, with a laminate being formed by wet lamination, dry lamination, hot melt lamination, melt extrusion lamination, or coextrusion processing or the like.

The thickness of the film-shaped firing material provided with a support sheet is typically within a range from 25 to 1,000 μm, preferably from 45 to 800 μm, and particularly preferably from about 100 to 500 μm.

<<Method for Manufacturing Film-Shaped Firing Material Provided with Support Sheet>>

A method for manufacturing the film-shaped firing material provided with a support sheet described above has a step of printing a composition containing sinterable metal particles and a binder component onto a release film to obtain a film-shaped firing material, and then providing the film-shaped firing material on a support sheet.

For example, the composition containing the sinterable metal particles and the binder component is printed onto the second release film, and then drying is performed as necessary to volatilize the solvent and form a film. This forms a film-shaped firing material on the second release film. A separate first release film is then laminated on top of this film-shaped firing material, thus preparing a laminate having a structure composed of second release film/film-shaped firing material/first release film, in that order. Subsequently, by detaching the first release film from the film-shaped firing material while laminating a support sheet to the film-shaped firing material, a film-shaped firing material provided with a support sheet can be produced having a structure compose of support sheet/film-shaped firing material/second release film, in that order. The second release film on the film-shaped firing material may be removed as necessary following formation of the laminated structure.

Furthermore, by printing the composition containing the sinterable metal particles and the binder component onto the second release film, and then performing drying as necessary to volatilize the solvent and form a film, a film-shaped firing material is formed on the second release film. A separate first release film is then laminated on top of the film-shaped firing material, thus preparing a laminate having a structure composed of second release film/film-shaped firing material/first release film, in that order. By applying an adhesive composition to a separate third release film, and then performing drying as necessary to volatilize the solvent and form a film, an adhesive layer is formed on the third release film. By subsequently laminating a substrate film to the adhesive layer, a laminate is prepared with a structure composed of substrate film/adhesive layer/third release film, in that order. Thereafter, by removing the first and third release films from the film-shaped firing material and the adhesive layer respectively, while laminating the film-shaped firing material to the exposed surface of the adhesive layer that has already been laminate to the substrate film, a film-shaped firing material provided with a support sheet can be produced that has a structure composed of substrate film/adhesive layer/film-shaped firing material/second release film, in that order. At this time, if the average thickness of the portion of the film-shaped firing material excluding the edge portion is deemed 100%, then by using a film-shaped firing material for which the average thickness of the edge portion of the film-shaped firing material is at least 5% thicker, or at least 5% thinner, than the average thickness of the portion of the film-shaped firing material excluding the edge portion, the first release film can be detached at the targeted interface between the first release film and the film-shaped firing material. As a result, a film-shaped firing material provided with a support sheet having the structure described above can be produced in a stable manner. Further, the second release film on the film-shaped firing material provided with a support sheet may be removed as required following formation of the laminated structure.

In this manner, the adhesive layer or the film-shaped firing material that constitute the film-shaped firing material provided with a support sheet can be prepared in advance on the substrate film or the second release film, and then laminated together using a method in which the surfaces of the target layers are bonded together, and the film-shaped firing material provided with a support sheet may be produced by appropriate selection of layers employing these types of steps as required.

Following provision of all of the required layers, the film-shaped firing material provided with a support sheet is stored with the second release film affixed to the surface of the outermost layer on the opposite side from the support sheet.

Furthermore, as described above in the method for manufacturing a film-shaped firing material, instead of applying the firing material composition described above, the film-shaped firing material can be obtained by printing a composition containing sinterable metal particles and a binder component onto the second release film. The film-shaped firing material may then be provided on a support sheet to obtain a film-shaped firing material provided with a support sheet.

<<Method for Manufacturing Element>>

Next is a description of a method for using the film-shaped firing material provided with a support sheet according to the present invention, using an example in which the film-shaped firing material provided with a support sheet is used in the manufacture of an element (such as a semiconductor element).

In one embodiment of the present invention, a method for manufacturing a semiconductor element using a film-shaped firing material provided with a support sheet may be conducted by detaching the release film from the film-shaped firing material provided with a support sheet, affixing the film-shaped firing material provided with a support sheet to the back surface of a semiconductor wafer (work) having a circuit formed on the upper surface, and then either performing steps (1) and (2) described below in the order of (1) and then (2), or performing steps (1) to (4) described below in the order of (1), (2), (3), and then (4).

Step (1): a step of dicing both the semiconductor wafer (work) and the film-shaped firing material of a laminate having a support sheet, the film-shaped firing material and the semiconductor wafer (work) laminated together in that order.

Step (2): a step of detaching the film-shaped firing material from the support sheet to obtain an element provided with the film-shaped firing material.

Step (3): a step of affixing the element provided with the film-shaped firing material to the surface of an adherend.

Step (4): a step of firing the film-shaped firing material to bond the semiconductor element and the adherend.

The case in which the above steps (1) to (4) are performed is described below.

The semiconductor wafer may be a silicon wafer, or may be a compound semiconductor wafer containing gallium and arsenic or the like. Formation of the circuit on the wafer surface can be achieved by all manner of methods including conventional employed methods such as etching methods and lift-off methods. Subsequently, the surface of the semiconductor wafer opposite the circuit surface (namely, the back surface) is ground. There are no particular limitations on the grinding method used, and the grinding may be performed by a conventional technique using a grinder or the like. During the back surface grinding, an adhesive sheet known as a surface protective sheet is affixed to the circuit surface to protect the circuit on the upper surface. The back surface grinding is performed by securing the circuit surface side of the wafer (namely, the surface protective sheet side) using a chuck table or the like, and then grinding the back surface on which no circuit is formed with a grinder. The thickness of the wafer following grinding is not particularly limited, but is typically about 20 to 500 µm. Subsequently, if necessary, the fractured layer generated during the back surface grinding is removed. Removal of the fractured layer is achieved by chemical etching or plasma etching or the like.

Next, the film-shaped firing material of the film-shaped firing material provided with a support sheet described above is affixed to the back surface of the semiconductor wafer. Subsequently, the steps (1) to (4) are performed in the order of (1), (2), (3), and then (4).

In step (1), a laminate composed of semiconductor wafer/film-shaped firing material/support sheet is diced into the individual circuits formed on the wafer surface, thus obtaining laminates each composed of semiconductor element/film-shaped firing material/support sheet.

The dicing is performed by cutting both the wafer and the film-shaped firing material. The film-shaped firing material provided with a support sheet according to an embodiment of the present invention has favorable adhesive strength between the film-shaped firing material and the support sheet during dicing, and therefore chipping and element scattering can be prevented, and the suitability to dicing is excellent. There are no particular limitations on the dicing method, and in one example, the peripheral portion of the support sheet (the outer peripheral portion of the support) is secured to a ring frame during wafer dicing, and a conventional technique using a rotating blade such as a dicing blade is used to cut the wafer into individual elements. The depth of the cut made into the support sheet by the dicing may involve cutting completely through the film-shaped firing material, and cutting to a depth that is 0 to 30 µm from the interface between the film-shaped firing material and the support sheet is preferred. By reducing the amount of cutting of the support sheet, melting of the adhesive layer or the substrate film that constitute the support sheet caused by the friction of the dicing blade, and the occurrence of burrs (unevenness produced by the above melting) can be suppressed.

Subsequently, in step (2), the film-shaped firing material is detached from the support sheet to obtain elements provided with a film-shaped firing material.

In step (2), the support sheet may be expanded. When a film having excellent extensibility is selected as the substrate film for the support sheet, the support sheet exhibits excellent expandability. By picking up the diced semiconductor elements provided with a film-shaped firing material using a general-purpose device such a collet, the film-shaped firing material is detached from the support sheet. As a result, semiconductor elements having a film-shaped firing material on the back surface (semiconductor elements provide with a film-shaped firing material) are obtained.

Subsequently, in step (3), the element provide with a film-shaped firing material is affixed to the surface of an adherend. For example, the element provided with a film-shaped firing material is affixed to the surface of an adherend such as a substrate, lead frame or heat sink.

Next, in step (4), the film-shaped firing material is fired, thereby bonding the semiconductor element and the adherend together. For example, the film-shaped firing material is fired, thereby sinter bonding the adherend such as a substrate, lead frame or heat sink to the element. During this process, provided the exposed surface of the film-shaped firing material in the element provided with the film-shaped firing material is affixed to the adherend such as a substrate, lead frame or heat sink, the semiconductor element and the adherend can be sinter bonded together via the film-shaped firing material.

The heating temperature for firing the film-shaped firing material may be determined appropriately with due consideration of factors such as the type of film-shaped firing material, but is preferably within a range from 100 to 600° C., more preferably from 150 to 550° C., and even more preferably from 250 to 500° C. The heating time may be determined appropriately with due consideration of factors such as the type of film-shaped firing material, but is preferably within a range from 5 seconds to 60 minutes, more preferably from 5 seconds to 30 minutes, and even more preferably from 5 seconds to 10 minutes.

The heating time means the time from the point where the desired heating temperature is reached, until retention of that heating temperature is stopped.

The firing of the film-shaped firing material may also be performed by pressurized firing in which pressure is applied to the film-shaped firing material. In one example, the pressurization conditions may be set to about 1 to 50 MPa.

By using the method for manufacturing an element according to the present embodiment, a film-shaped firing material having superior uniformity of thickness compared with a firing material formed by application of a paste material can be formed easily on the back surface of the element. Therefore, cracking during the dicing step and following packaging is less likely to occur. Further, by using the method for manufacturing an element of the present embodiment, semiconductor elements provided with a film-shaped firing material can be obtained without needing to affix a film-shaped firing material individually to the back surface of each individual semiconductor element. By virtue of this, the manufacturing process can be simplified. By subsequently positioning the semiconductor element provided with the film-shaped firing material on a desired adherend such as a device substrate, and then performing firing, a semiconductor device can be manufactured in which the semiconductor element and the adherend are sinter bonded together via the film-shaped firing material.

In one embodiment of the present invention, a semiconductor element provided with a film-shaped firing material, containing a semiconductor element and a film-shaped firing material of an embodiment can be obtained. In one example, the semiconductor provided with a film-shaped firing material can be manufactured using the method for manufacturing an element described above.

In the embodiments described above, the cases of sinter bonding to a semiconductor element and sinter bonding between a semiconductor element and an adherend were described, but the sinter bonding target for the film-shaped firing material is not restricted to the above examples, and sinter bonding to all manner of articles that have been brought into contact with the film-shaped firing material and then sintered are possible.

EXAMPLES

The present invention is described below in further detail using a series of examples and the like, but the scope of the present invention is in no way limited by these examples.

<Manufacture of Firing Material Composition>

The components used in manufacturing the firing material compositions are described below. In this description, metal particles having a particle size of not more than 100 nm are described as "sinterable metal particles", and metal particles having a particle size exceeding 100 nm are described as "non-sinterable metal particles".

(Sinterable Metal Particle-Containing Paste Materials)

Alconano Silver Paste ANP-1 (an organic-coated composite silver nano-paste, manufactured by Applied Nanoparticle Laboratory Corporation: alcohol derivative-coated silver particles, metal content: at least 70 wt %, silver particles of not more than 100 nm: at least 60 wt %)

Alconano Silver Paste ANP-4 (an organic-coated composite silver nano-paste, manufactured by Applied Nanoparticle Laboratory Corporation: alcohol derivative-coated silver particles, metal content: at least 80 wt %, silver particles of not more than 100 nm: at least 25 wt %)

(Binder Component)

Using an evaporator under conditions of 60° C. and 200 hPa, the MEK (methyl ethyl ketone) was volatilized from a commercially available acrylic polymer (2-ethylhexyl methacrylate polymer, average molecular weight: 28,000, L-0818, manufactured by The Nippon Synthetic Chemical Industry Co., Ltd., a product diluted with MEK, solid fraction: 54.5% by mass). A volume of butyl carbitol (manufactured by Kanto Chemical Co., Inc., boiling point: 230° C.) equal to the volume of the volatilized MEK was added, and the polymer was once again dispersed and diluted to complete preparation of a binder component (solid fraction: 54.5% by mass).

(High-Boiling Point Solvent)
Butyl carbitol (manufactured by Kanto Chemical Co., Inc., boiling point: 230° C.)

following drying at 150° C. for 10 minutes, a first release film 30 composed of a polyethylene terephthalate film having a surface that had been subjected to a release

TABLE 1

|  |  |  | Examples | | | Reference Examples | | Comparative Example |
|---|---|---|---|---|---|---|---|---|
|  |  |  | 1 | 2 | 3 | 1 | 2 | 1 |
| Firing material composition | Sinter metal particle-containing paste material | ANP-1 | 72.0 | — | — | 61.7 | — | — |
|  |  | ANP-4 | — | 66.7 | 57.2 | — | 57.2 | 62.0 |
|  | Acrylic polymer |  | 18.6 | 18.6 | 16.0 | 16.0 | 16.0 | 17.3 |
|  | Butyl carbitol |  | 9.4 | 14.7 | 26.8 | 22.3 | 26.8 | 20.7 |
| Solid fraction concentration (wt %) | | | 70 | 70 | 60 | 60 | 60 | 65 |
| Average thickness of central portion of film-shaped firing material [μm] | | | 75 | 75 | 40 | 75 | 75 | 61 |
| Average thickness of edge portion (2 mm from edge) [μm] | | | 89 | 95 | 32 | 66 | 64 | 63 |
| Difference between average thickness of central portion and average thickness of edge portion (2 mm from edge) [%] | | | 19 | 27 | −20 | −12 | −15 | 3.3 |
| Method for manufacturing film-shaped firing material | | | printing | printing | printing | coating and cutting | coating and cutting | printing |
| Incision of at least 3 μm in surface of second release film 31 | | | no | no | no | yes | yes | no |
| Detachment at interface with second release film 31 upon detachment of first release film 30 | | | no | no | no | no | no | yes |
| Detachment between film-shaped firing material and adhesive layer of dicing sheet (support sheet 2) upon detachment of second release film 31 | | | no | no | no | no | yes | — |
| Damage to film-shaped firing material 1 upon detachment of second release film 31 | | | no | no | no | yes | yes | — |

The components were mixed in the formulations shown in Table 1, thus obtaining firing material compositions corresponding with Examples 1 to 3, Reference Examples 1 to 2 and Comparative Example 1. The values for the components of the firing material compositions shown in Table 1 represent parts by mass. The sinterable metal particle-containing paste materials are marketed in a form containing high-boiling point solvents, and because these solvents have a large effect on the average thickness of the edge portion of the film-shaped firing material following printing and drying, the amounts of the sinterable metal particle-containing paste material components include these solvents. Further, in a similar manner, considering the fact that the amount of the solvent component in the binder component has a large effect on the average thickness of the edge portion of the film-shaped firing material following printing and drying, a parts by mass value that includes the solvent component is recorded.

In the following description, a liquid material used for screen printing or coating application is termed a "firing material composition", whereas a material obtained following printing or coating and then drying of such a firing material composition is termed a "film-shaped firing material". Furthermore, evaporation of the butyl carbitol described in the examples and the comparative example is termed "drying", and during this drying process, the form of the firing material changes from a liquid material to a film-shaped material.

Manufacture of Film-Shaped Firing Materials of Examples and Comparative Example

Each of the firing material compositions obtained above was screen printed onto one surface of a second release film 31 composed of a polyethylene terephthalate film having a surface that had been subjected to a release treatment (SP-PET382150, manufactured by Lintec Corporation, thickness: 38 μm) using a circular mesh printing plate having a diameter of 15 cm and a metal squeegee, and treatment (SP-PET381031, manufactured by Lintec Corporation, thickness: 38 μm) having a surface area substantially larger than a circle of 15 cm diameter was affixed to the opposite surface from the second release film 31. This yielded a film-shaped firing material 1 having a thickness shown in Table 1 in which one surface was protected by the second release film 31 and the opposite surface was protected by the first release film 30.

Manufacture of Film-Shaped Firing Materials Provided with a Support Sheet of Examples and Comparative Example The first release film 30 was detached from the film-shaped firing material obtained above, and the adhesive layer surface of a dicing sheet (Adwill G-11, manufactured by Lintec Corporation) was affixed and laminated to the exposed surface of the film-shaped firing material as a support sheet having an adhesive layer with a thickness of 10 μm laminated to a substrate film with a thickness of 70 μm. As a result, a film-shaped firing material provided with a support sheet 100c was obtained, composed of the circular film-shaped firing material and the second release film 31 with a substantially large surface area laminated to the dicing sheet (support sheet 2) having the adhesive layer on the substrate film.

Manufacture of Film-Shaped Firing Materials of Reference Examples

Each of the firing material compositions obtained above was coated onto one surface of a second release film 31 composed of a polyethylene terephthalate film having a surface that had been subjected to a release treatment (SP-PET382150, manufactured by Lintec Corporation, thickness: 38 μm), drying was performed at 150° C. for 10 minutes, and a first release film 30 was affixed to the opposite surface from the second release film 31, thus obtaining a film-shaped firing material 1 having a thickness shown in Table 1 in which one surface was protected by the first release film 30 composed of a release-treated polyethylene terephthalate film and the opposite surface was protected with the second release film 31.

Manufacture of Film-Shaped Firing Materials Provided with a Support Sheet of Reference Examples The first release film 30 was detached from the film-shaped firing material obtained above, and using a circular blade with a diameter of 15 cm, an incision having a depth of at least 3 μm through the thickness direction of the second release film 31 was inserted from the exposed surface of the film-shaped firing material so that the film-shaped firing material was completely cut, and by subsequently removing the portion of the film-shaped firing material outside the circular portion, a circular film-shaped firing material with a diameter of 15 cm was obtained having the second release film 31 with a surface area with a diameter substantially larger than 15 cm laminated to the firing material.

The adhesive layer surface of a dicing sheet Adwill G-11 composed of an adhesive layer laminated to a substrate film was then affixed and laminated to the film-shaped firing material. As a result, a film-shaped firing material provided with a support sheet 100*d* was obtained, composed of the circular film-shaped firing material and the second release film 31 with an incision of the same shape as the film-shaped firing material laminated to the dicing sheet (support sheet 2) having the adhesive layer on the substrate film.

<Method for Evaluating Releasability of Release Film of Film-Shaped Firing Material>

After at least 30 days had elapsed from the manufacture of each of the above film-shaped firing materials provided with a support sheet 100*c* and 100*d*, the surface second release film 31 laminated to the opposite surface from the dicing sheet (support sheet 2) was detached, and the presence or absence of detachment at the interface between the film-shaped firing material 1 and the adhesive layer of the dicing sheet (support sheet 2), and the presence or absence of damage to the film-shaped firing material 1 were confirmed by visual inspection.

(Measurement of Thickness)

The average thickness of the central portion of each film-shaped firing material from the above examples, reference examples and comparative example refers to the average thickness of the portion of the film-shaped firing material excluding the edge portion, and was recorded as the average of the thickness values at 5 random locations measured in accordance with JIS K7130 using a constant pressure thickness gauge (product name: PG-02, manufactured by Teclock Co., Ltd.). For the 5 random locations, portions were selected that avoided thick and thin portions of the film-shaped firing material.

The average thickness of the edge portion of each film-shaped firing material from the above examples, reference examples and comparative example refers to the average thickness of 5 random locations of the film-shaped firing material formed on the second release film 31 measured in accordance with JIS K7130 using a constant pressure thickness gauge (product name: PG-02, manufactured by Teclock Co., Ltd.). For the 5 random locations, portions that were thicker or thinner than the average thickness of the central portion of the film-shaped firing material were selected.

The difference [%] between the average thickness of the central portion of the film-shaped firing material and the average thickness of the edge portion was determined using the following formula (1).

Difference between average thickness of central portion and average thickness of edge portion [%]= (average thickness of edge portion [μm]−average thickness of central portion [μm])/average thickness of central portion [μm]×100    (1)

In Examples 1 to 3, in the film-shaped firing materials having the first release film 30 and the second release film 31 laminated thereto, when the first release film 30 was detached from the film-shaped firing material, no detachment occurred at the interface between the film-shaped firing material and the second release film 31. In the case of the film-shaped firing materials provided with a support sheet of Examples 1 to 3, when the second release film 31 was detached from the film-shaped firing material, no detachment occurred at the interface between the film-shaped firing material and the adhesive layer of the dicing sheet (support sheet 2). Moreover, when the second release film 31 was detached from the film-shaped firing material, no damage to the film-shaped firing material occurred.

In contrast, in Reference Example 1, in the film-shaped firing material having the first release film 30 and the second release film 31 laminated thereto, when the first release film 30 was detached from the film-shaped firing material, no detachment occurred at the interface between the film-shaped firing material and the second release film 31. It is thought that this is because the difference [%] between the average thickness of the central portion of the film-shaped firing material and the average thickness of the edge portion A was −12%. However, as a result of the incision of at least 3 μm in the surface of the second release film 31, when the second release film 31 was detached from the film-shaped firing material 1, damage to the film-shaped firing material 1 occurred.

In Reference Example 2, in the film-shaped firing material having the first release film 30 and the second release film 31 laminated thereto, when the first release film 30 was detached from the film-shaped firing material, no detachment occurred at the interface between the film-shaped firing material and the second release film 31. It is thought that this is because the difference [%] between the average thickness of the central portion of the film-shaped firing material and the average thickness of the edge portion A was −15%. However, as a result of the incision of at least 3 μm in the surface of the second release film 31, when the second release film 31 was detached from the film-shaped firing material, detachment occurred at the interface between the film-shaped firing material and the adhesive layer of the dicing sheet (support sheet 2). Moreover, when the second release film 31 was detached from the film-shaped firing material 1, damage to the film-shaped firing material 1 also occurred.

In Comparative Example 1, in the film-shaped firing material having the first release film 30 and the second release film 31 laminated thereto, when the first release film 30 was detached from the film-shaped firing material, detachment occurred at the interface between the film-shaped firing material and the second release film 31. It is thought that this is because the difference [%] between the average thickness of the central portion of the film-shaped firing material and the average thickness of the edge portion A was 3.3%.

The various structures and combinations and the like described in each of the embodiments are merely examples, and additions, omissions, substitutions and other modifications can be made to the structures without departing from the spirit or scope of the present invention. Further, the present invention is not to be considered as being limited by the above embodiments, and is only limited by the scope of the claims.

INDUSTRIAL APPLICABILITY

The present invention is able to provide a film-shaped firing material that exhibits excellent thickness stability and thermal conductivity, and is unlikely to suffer damage of the firing material during use.

DESCRIPTION OF THE REFERENCE SIGNS 1, 1a, 1b: Film-shaped firing material
1c: Firing material
2: Support sheet
3: Substrate film
4: Adhesive layer
5: Ring frame
10, 11: Sinterable metal particles
20, 21: Binder component
30, 31: Release film
A, A': Edge portion
B: Portion excluding edge portion A
B': Portion excluding edge portion A'
100a, 100b, 100c, 100d: Film-shaped firing material provided with a support sheet
I: Incision

The invention claimed is:

1. A film-shaped firing material comprising:
   metal particles; and
   a binder component, wherein:
   the film-shaped firing material includes a central portion and an edge portion located at a periphery of the central portion, and
   an average thickness of at least one part of the edge portion of the film-shaped firing material is at least 5% thicker than an average thickness of the central portion of the film-shaped firing material,
   the film-shaped firing material is formed from a firing material composition containing the metal particles and the binder component, and
   a viscosity of the firing material composition is from 10 to 100 Pa·s.

2. A film-shaped firing material comprising:
   metal particles; and
   a binder component, wherein:
   the film-shaped firing material includes a central portion and an edge portion located at a periphery of the central portion,
   an average thickness of at least one part of the edge portion of the film-shaped firing material is at least 5% thinner than an average thickness of the central portion of the film-shaped firing material,
   the film-shaped firing material is formed from a firing material composition containing the metal particles and the binder component, and
   a viscosity of the firing material composition is from 0.1 to 5 Pa·s.

3. A film-shaped firing material provided with a support sheet, comprising:
   the film-shaped firing material according to claim 1;
   a support sheet provided on one side of the film-shaped firing material; and
   a release film provided on another side.

4. A film-shaped firing material provided with a support sheet, comprising:
   the film-shaped firing material according to claim 2;
   a support sheet provided on one side of the film-shaped firing material; and
   a release film provided on another side.

5. The film shaped firing material according to claim 1, wherein the film-shaped firing material is formed from a firing material composition containing the metal particles, the binder component, and a solvent having a boiling point of 200 to 350° C.

6. The film shaped firing material according to claim 2, wherein the film-shaped firing material is formed from a firing material composition containing the metal particles, the binder component, and a solvent having a boiling point of 200 to 350° C.

7. The film shaped firing material according to claim 1, wherein the particle size of metal particles is 0.5 to 50 nm.

8. The film shaped firing material according to claim 2, wherein the particle size of metal particles is 0.5 to 50 nm.

9. The film shaped firing material according to claim 2, wherein the film-shaped firing material is formed from a firing material composition containing the metal particles and the binder component, and a solid fraction concentration of the firing material composition is 60 wt % or less.

10. The film shaped firing material according to claim 1, wherein the film-shaped firing material is formed from a firing material composition containing the metal particles and the binder component, and the firing material composition is free of a copolymerizable monomer.

11. The film shaped firing material according to claim 2, wherein the film-shaped firing material is formed from a firing material composition containing the metal particles and the binder component, and the firing material composition is free of a copolymerizable monomer.

12. The film shaped firing material according to claim 1, wherein:
    the central portion is located at a center of the film-shaped firing material,
    the edge portion is located at a periphery of the film-shaped firing material and surrounds the central portion,
    the average thickness of an entirely of the edge portion is at least 5% thicker than the average thickness of the central portion,
    a side of the edge portion facing the central portion has a curved surface, and
    the curved surface of the edge portion and a side of the edge portion facing an opposite side of the central portion form a sharp corner.

13. A method for manufacturing the film-shaped material of claim 1, the method comprising printing the firing material composition comprising the metal particles and the binder component.

14. The method according to claim 13, wherein the film-shaped firing material is formed from a firing material composition containing the metal particles, the binder component, and a solvent having a boiling point of 200 to 350° C.

15. The method according to claim 13, wherein the particle size of metal particles is 0.5 to 50 nm.

16. The method according to claim 13, wherein the film-shaped firing material is formed from a firing material composition containing the metal particles and the binder component, and the firing material composition is free of a copolymerizable monomer.

17. The method according to claim 13, wherein:
the central portion is located at a center of the film-shaped firing material,
the edge portion is located at a periphery of the film-shaped firing material and surrounds the central portion,
the average thickness of an entirely of the edge portion is at least 5% thicker than the average thickness of the central portion,
a side of the edge portion facing the central portion has a curved surface, and
the curved surface of the edge portion and a side of the edge portion facing an opposite side of the central portion form a sharp corner.

18. A method for manufacturing the film-shaped material of claim 1, the method comprising:
printing the firing material composition comprising the metal particles and the binder component onto a release film to obtain the film-shaped firing material; and
providing the film-shaped material on a support sheet.

19. The method according to claim 18, wherein the film-shaped firing material is formed from a firing material composition containing the metal particles, the binder component, and a solvent having a boiling point of 200 to 350° C.

20. The method according to claim 18, wherein the particle size of metal particles is 0.5 to 50 nm.

* * * * *